(12) United States Patent
Mori et al.

(10) Patent No.: US 10,909,277 B2
(45) Date of Patent: *Feb. 2, 2021

(54) SIMULATION DEVICE, SIMULATION METHOD, CONTROL PROGRAM AND RECORDING MEDIUM

(71) Applicant: OMRON Corporation, Kyoto (JP)

(72) Inventors: Yasumoto Mori, Joyo (JP); Mamoru Egi, Otsu (JP); Shota Miyaguchi, Nara (JP)

(73) Assignee: OMRON Corporation, Kyoto (JP)

( * ) Notice: Subject to any disclaimer, the term of this patent is extended or adjusted under 35 U.S.C. 154(b) by 735 days.

This patent is subject to a terminal disclaimer.

(21) Appl. No.: 15/409,541

(22) Filed: Jan. 19, 2017

(65) Prior Publication Data

US 2017/0262572 A1 Sep. 14, 2017

(30) Foreign Application Priority Data

Mar. 14, 2016 (JP) ................................ 2016-049315

(51) Int. Cl.
*G06F 17/10* (2006.01)
*G06F 30/17* (2020.01)
(Continued)

(52) U.S. Cl.
CPC ........... *G06F 30/17* (2020.01); *G05B 13/044* (2013.01); *G05B 17/02* (2013.01); *G06F 17/141* (2013.01);
(Continued)

(58) Field of Classification Search
None
See application file for complete search history.

(56) References Cited

U.S. PATENT DOCUMENTS 4,876,494 A * 10/1989 Daggett ............. G05B 19/4141
318/568.22
5,172,312 A * 12/1992 Iino ........................ G05B 17/02
700/29
(Continued)

FOREIGN PATENT DOCUMENTS

| CN | 1448816 | 10/2003 |
|---|---|---|
| CN | 101640511 | 2/2010 |

(Continued)

OTHER PUBLICATIONS

"Search Report of Europe Counterpart Application," dated Aug. 4, 2017, p. 1-p. 9, in which the listed references were cited.

(Continued)

*Primary Examiner* — Rehana Perveen
*Assistant Examiner* — Nithya J. Moll
(74) *Attorney, Agent, or Firm* — JCIPRNET

(57) ABSTRACT

The present invention is suitable for easily properly setting control parameters in short time. The simulation device of the present invention comprises: a frequency response function computing part (53) computing a frequency response function according to a first command value and a measured value of a mechanical system; an impulse response computing part (41) computing an impulse response by performing inverse Fourier transform on the frequency response function obtained according to the frequency response function and the control parameters; and a time response outputting part (44) executing time response simulation of the mechanical system (7) according to a second command value and the impulse response.

13 Claims, 14 Drawing Sheets

(51) Int. Cl.
*G05B 13/04* (2006.01)
*G05B 17/02* (2006.01)
*G06F 30/20* (2020.01)
*G06F 17/14* (2006.01)

(52) U.S. Cl.
CPC ............ *G06F 30/20* (2020.01); *G05B 13/042* (2013.01); *G05B 2219/37612* (2013.01); *G05B 2219/42154* (2013.01); *G05B 2219/42155* (2013.01); *G05B 2219/42163* (2013.01)

(56) References Cited

U.S. PATENT DOCUMENTS

| | | | | |
|---|---|---|---|---|
| 5,859,774 | A * | 1/1999 | Kuzuya | B62D 7/159 180/197 |
| 6,198,246 | B1 * | 3/2001 | Yutkowitz | G05B 11/42 318/561 |
| 6,256,545 | B1 * | 7/2001 | Kimura | F16F 13/26 381/71.4 |
| 2004/0090198 | A1 * | 5/2004 | Kaku | B25J 9/163 318/432 |
| 2005/0211198 | A1 * | 9/2005 | Froeschle | F02D 41/20 123/90.11 |

FOREIGN PATENT DOCUMENTS

| | | |
|---|---|---|
| EP | 0379215 | 7/1990 |
| EP | 1313207 | 5/2003 |
| EP | 2157489 | 2/2010 |
| JP | 2006-340480 | 12/2006 |
| JP | 2009-122779 | 6/2009 |
| JP | 2010051061 | 3/2010 |

OTHER PUBLICATIONS

"Office Action of China Counterpart Application," with English translation thereof, dated Sep. 27, 2019, pp. 1-10.

* cited by examiner

Basic structure of simulation system

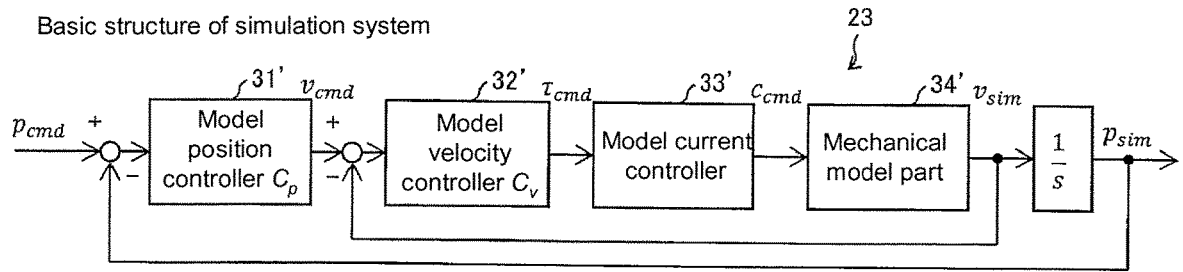

FIG. 8a

Simulation-0: a condition of replacing all control blocks of a simulation system with one frequency transfer function for simulation

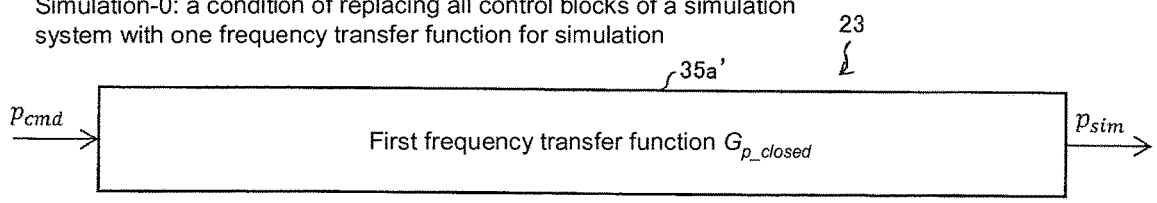

FIG. 8b

Simulation-1: a condition of replacing a model velocity controller, a model current controller and a mechanical model part of the simulation system with one frequency transfer function for simulation

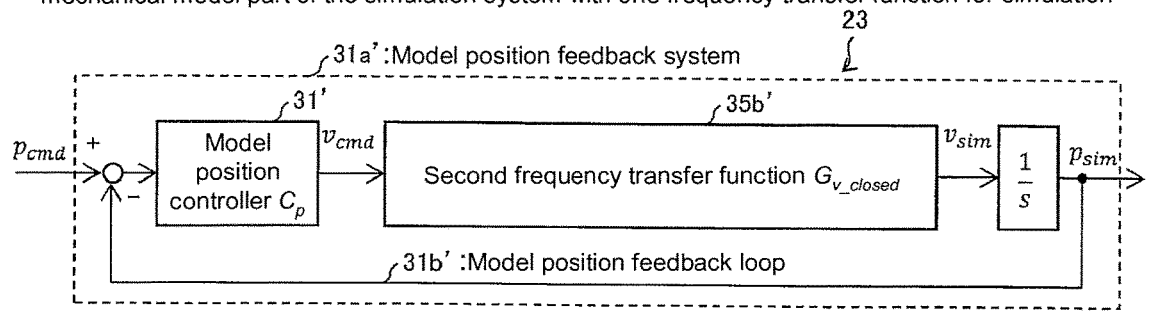

FIG. 8c

Simulation-2: a condition of replacing a model current controller and a mechanical model part of the simulation system with one frequency transfer function for simulation

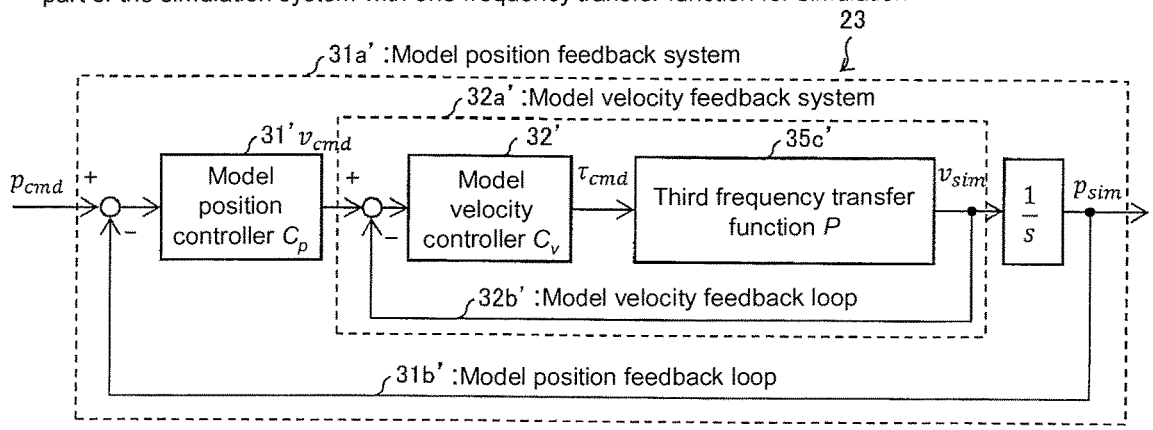

FIG. 8d

Block diagram illustrating a control structure of a servo driver with a feedforward device Structure of simulation system having model feedforward device Simulation-3: simulation having a model feedforward device Block diagram illustrating a control structure of a servo driver during velocity control

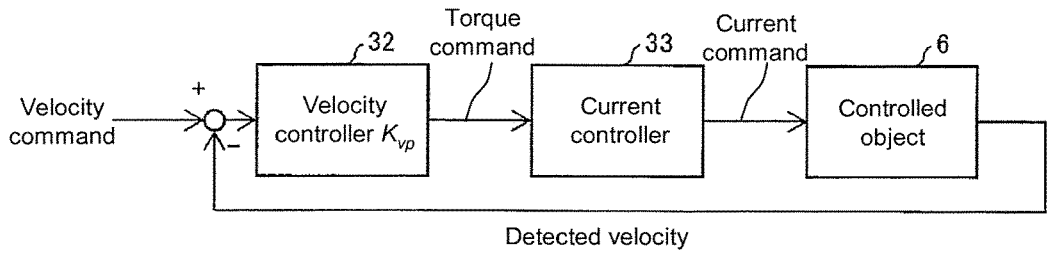

FIG. 14a

Structure of simulation system during simulation of velocity control

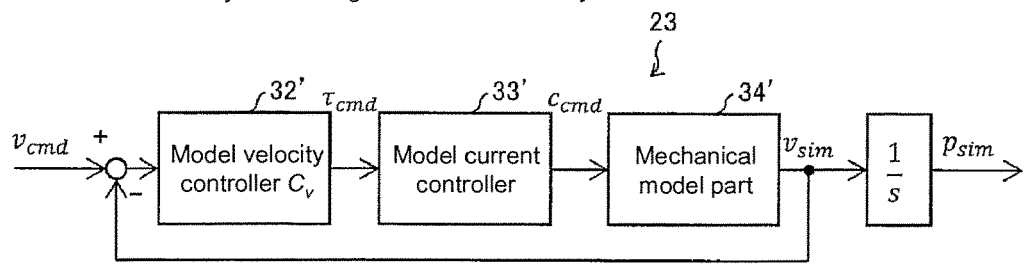

FIG. 14b

Simulation-4: a condition of replacing the model velocity controller, model current controller and the mechanical model part of the simulation system with one frequency transfer function for simulation

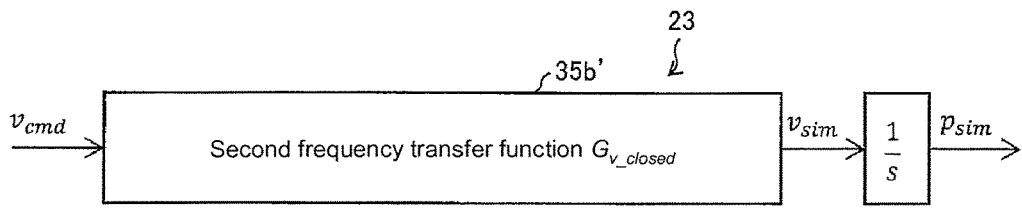

FIG. 14c

Simulation-5, a condition of replacing the model current controller and mechanical model part of the simulation system with one frequency transfer function for simulation

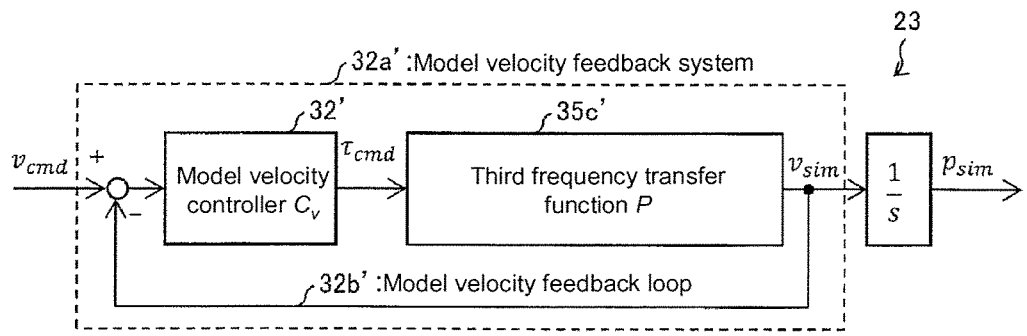

FIG. 14d

Block diagram illustrating a control structure of a servo driver during torque control Structure of the simulation system during simulation of torque control Simulation-6: a condition of replacing the model current controller and mechanical model part of the simulation system with one frequency transfer function for simulation

SIMULATION DEVICE, SIMULATION METHOD, CONTROL PROGRAM AND RECORDING MEDIUM

CROSS-REFERENCE TO RELATED APPLICATION

This application claims the priority benefit of Japan application no. P 2016-049315, filed on Mar. 14, 2016. The entirety of the above-mentioned patent application is hereby incorporated by reference herein and made a part of this specification.

BACKGROUND OF THE INVENTION

1. Field of the Invention

The present invention relates to a simulation device, which simulates a response of a servo driver of a motor controlling and driving a load device.

2. Description of Related Art

In a servo mechanism, in order to properly control the motor for driving a load device, generally, control parameters (position gain, velocity gain, a cut off frequency of a filter, etc.) of the servo driver controlling the motor are adjusted generally.

In the past, in adjusting methods of the control parameters, there is an adjusting method of actually operating the load device through driving the motor. That is, a certain control parameter is set to the servo driver to actually drive the motor, and a response of the load device at this point is measured. At this point, when a response state of the load device does not meet a required condition, the control parameter is changed and the motor is driven again, and the response of the load device at this point is measured. By changing the control parameter in this way and driving the motor repeatedly, the load device is operated, and thus the control parameter is set (for example patent document 1).

Besides, except for the method of actually operating the device to set the control parameter, there is a method of setting the control parameter through simulation. That is, a physical model of the servo driver and the load device is used to set the control parameter for simulation. Besides, the control parameter is set according to a fact whether the response state obtained as a simulation result meets the required condition (for example patent document 2).

PRIOR TECHNICAL DOCUMENTS

Patent Document

Patent document 1: Japanese Patent laid open No. 2009-122779 gazette (published on Jun. 4, 2009)

Patent document 2: Japanese Patent laid open No. 2006-340480 gazette (published on Dec. 14, 2006)

SUMMARY OF THE INVENTION

Problem to be Solved by the Invention

However, the prior art as abovementioned has the following problem. At first, under the condition of actually actuating the device to measure the response, when the control parameter is set every time, the motor must be actually driven to measure the response of the load device, as a result, the adjusting is very time consuming. Besides, if an improper control parameter is set, then the device may be damaged duet to an unexpected actuation.

Besides, under the condition of using the model for simulation, a simulated controlled object is limited to a form of the model or times, Therefore, if the form of the control model differs from characteristics of the actual device, then a simulation precision is reduced. Besides, in order that the model and actual device are consistent in characteristic, the parameter must be properly set, which requires excessive knowledge of a user.

The present invention is finished in view of the problem, and aims to realize a simulation device, which can easily and properly set the control parameter in short time.

Technical Means Solving the Problem

In order to solve the problem, the simulation device of the present invention simulates a mechanical system, the mechanical system has a controlled object containing a motor and a motor control device controlling the motor, the simulation device is characterized by comprising: a frequency response function computing part, computing a frequency response function containing characteristics of the controlled object based on a relation between a first command value driving the mechanical system and a measured value of the response of the mechanical system driven by the first command value; a simulation system, having a control block structure corresponding to the mechanical system; a parameter setting part, setting the control parameter changing the characteristics of the simulation system; a frequency transfer function setting part, setting a frequency transfer function computed based on the frequency response function or based on the frequency response function and the control parameter into a frequency transfer function for simulation; an impulse response computing part, computing an impulse response by performing inverse Fourier transform on the frequency transfer function for simulation; a second command value generating part, generating a second command value, the second command value being used for simulation by using the impulse response; and a time response outputting part, executing time response simulation of the mechanical system relative to the second command value based on the second command value and the impulse response.

According to the constitution, any input response relative to the servo driver can be confirmed through simulation, therefore, when the control parameter is set every time in order to confirm the response of the controlled object, the motor is not required to be actually driven to measure the response of the controlled object. Therefore, the adjusting time is shortened.

Besides, since a time response is output by using a response result, i.e., the frequency response function obtained by actually driving a driving part, the simulation can be performed with a better precision.

In the simulation device of the present invention, optionally, the mechanical system has at least one feedback system as the control block structure, the simulation system has at least one model feedback system corresponding to the feedback system, the frequency response function computing part computes the frequency response function containing the characteristics of the controlled object and not containing the characteristics of the at least one feedback system, the frequency transfer function setting part sets the frequency transfer function for simulation, containing the characteristics of the controlled object and not containing the characteristics of the at least one feedback system, and the time response outputting part executes time response simulation of the mechanical system relative to the second command value based on an output value obtained by inputting the second command value into the model feedback system and the impulse response computed by performing inverse Fourier transform on the frequency transfer function for simulation.

According to the constitution, since the feedback system is used to execute simulation, therefore even if the frequency response function obtained by performing actual driving contains an error, the error can be reduced through feedback. Therefore, more accurate simulation can be performed.

In the simulation device of the present invention, optionally, the simulation system contains a feedforward system, which outputs a feedforward value added to the output value, and the time response outputting part executes time response simulation of the mechanical system based on an addition value obtained by adding the output value to the feedforward value and the impulse response computed by performing inverse Fourier transform on the frequency transfer function for simulation.

According to the constitution, the system for feedforward can be simulated accurately.

In the simulation device of the present invention, optionally, the mechanical system contains a velocity feedback system containing a velocity controller as the control block structure, the simulation system has a model velocity feedback system corresponding to the velocity feedback system, the frequency response function computing part computes the frequency response function containing the characteristics of the controlled object and not containing the characteristics of the velocity feedback system, the frequency transfer function setting part sets the frequency transfer function for simulation, containing the characteristics of the controlled object and not containing the characteristics of the model velocity feedback system, and the time response outputting part executes time response simulation of the mechanical system based on an output value obtained by inputting the second command value into the model velocity feedback system and the impulse response computed by performing inverse Fourier transform on the frequency transfer function for simulation.

According to the constitution, since the velocity feedback system is used, the error of the frequency response function for inverse Fourier transform can be reduced. Therefore, the simulation with a high precision can be easily executed in short time.

Besides, since the impulse response is converged in short time, even if under the condition that the measurement time of the frequency response is relatively shorter, i.e., under the condition that the measured data are relatively less, the precision of the frequency response function can be ensured. Therefore, the measurement time during the frequency response measurement can be shortened.

In the simulation device of the present invention, optionally, the mechanical system has a position feedback system containing a position controller and a velocity feedback system containing a velocity controller configured on a downstream side of the position controller as the control block structure, the simulation system has a model position feedback system corresponding to the position feedback system and a model velocity feedback system corresponding to the velocity feedback system, the frequency response function computing part computes the frequency response function containing the characteristics of the controlled object and not containing the characteristics of the position feedback system and the velocity feedback system, the frequency transfer function setting part sets the frequency transfer function for simulation, containing the characteristics of the controlled object and the model velocity feedback system and not containing the characteristics of the model position feedback system, and the time response outputting part executes time response simulation of the mechanical system based on an output value obtained by inputting the second command value into the model position feedback system and the impulse response computed by performing inverse Fourier transform on the frequency transfer function for simulation.

According to the constitution, since the velocity feedback system and the position feedback system are used, the error of the frequency response function for inverse Fourier transform can be reduced. Therefore, the simulation with a high precision can be easily executed in short time.

Besides, since the impulse response is converged in short time, even if under the condition that the measurement time of the frequency response is relatively shorter, i.e., under the condition that the measured data are relatively less, the precision of the frequency response function can be ensured. Therefore, the measurement time during the frequency response measurement can be shortened.

In the simulation device of the present invention, optionally, the mechanical system has a position feedback system containing a position controller and a velocity feedback system containing a velocity controller configured on a downstream side of the position controller as the control block structure, the simulation system has a model position feedback system corresponding to the position feedback system and a model velocity feedback system corresponding to the velocity feedback system, the frequency response function computing part computes the frequency response function containing the characteristics of the controlled object and not containing the characteristics of the position feedback system and the velocity feedback system, the frequency transfer function setting part sets the frequency transfer function for simulation, containing the characteristics of the controlled object and not containing the characteristics of the model velocity feedback system and the model position feedback system, and the time response outputting part executes time response simulation of the mechanical system based on an output value obtained by inputting the second command value into the model position feedback system, an output value obtained by inputting the second command value into the model velocity feedback system, and the impulse response computed by performing inverse Fourier transform on the frequency transfer function for simulation.

According to the constitution, since the velocity feedback system and the position feedback system are used to execute the simulation, the simulation with a high precision can be easily executed in short time.

Besides, the frequency response function for computing the impulse response is a frequency response function of a system containing the system corresponding to the controlled object and not containing the velocity feedback system and the position feedback system, even if the parameters corresponding to the position controller and the parameter corresponding to the velocity controller are changed, the frequency response function is not required to be computed again. Therefore, the inverse Fourier transform with a large computing amount is not required to be calculated, and a handling capacity can be reduced.

Besides, the control called as gain schedule and changing the control parameter (gain) in the motor actuating process can be simulated.

In the simulation device of the present invention, optionally, the first command value is a torque command value representing a torque, and the frequency response function computing part computes the frequency response function based on a relation between the torque command value and the response, i.e., a velocity measured value, of the mechanical system driven by the torque command value.

According to the constitution, a torque command, i.e., the torque command value for measurement can be used to solve the characteristics, i.e., the frequency response function, of the controlled object when the motor is actually driven.

In the simulation device of the present invention, optionally, the first command value is a velocity command value representing a velocity, and the frequency response function computing part computes the frequency response function based on a relation between the velocity command value and the response, i.e., a velocity measured value, of the mechanical system driven by the velocity command value.

According to the constitution, a velocity command, i.e., the velocity command value for measurement can be used to solve the characteristics, i.e., the frequency response function, of the controlled object when the motor is actually driven.

In the simulation device of the present invention, optionally, the first command is a position command value representing a position, and the frequency response function computing part computes the frequency response function based on a relation between the position command value and the response, i.e., a position measured value, of the mechanical system driven by the position command value.

According to the constitution, a position command, i.e., the position command value for measurement can be used to solve the characteristics, i.e., the frequency response function, of the controlled object when the motor is actually driven.

In the simulation device of the present invention, optionally, the time response outputting part executes the time response simulation of at least any one of the position, velocity and torque of the mechanical system relative to the second command value.

According to the constitution, at least any one of any input position, velocity and torque of the controlled object relative to the servo driver can be simulated.

Besides, by merely using the frequency response function of the controlled object, the simulation of an additional torque filter (notch filter), a low pass filter, etc., can be easily executed.

In the simulation device of the present invention, optionally, the parameter setting part is structured in a manner of setting parameters at least one of the systems contained in the simulation system and corresponding to controllers in the mechanical system respectively.

According to the constitution, each of any control parameters can be subjected to time response simulation.

In order to solve the problem, a simulation method of the present invention performs simulation of a mechanical system, the mechanical system has a controlled object containing a motor and a motor control device controlling the motor, and the simulation method is characterized by comprising: a frequency response function computing step, computing a frequency response function containing characteristics of the controlled object based on a relation between a first command value driving the mechanical system and a measured value of the response of the mechanical system driven by the first command value; a parameter setting step, setting the control parameter changing the characteristics of a simulation system having a control block structure corresponding to the mechanical system; a frequency transfer function setting step, setting a frequency transfer function computed based on the frequency response function or based on the frequency response function and the control parameter into a frequency transfer function for simulation; a impulse response computing step, computing a impulse response by performing inverse Fourier transform on the frequency transfer function for simulation; a second command value generating step, generating a second command value, the second command value being used for simulation by using the impulse response; and a time response outputting step, executing time response simulation of the mechanical system relative to the second command value based on the second command value and the impulse response.

According to the method, the effects same as the aforesaid effects can be achieved.

The simulation device in various forms of the present invention can be realized by a computer, at this point, a control program realizing the simulation device by using the computer through using the computer as each part (software elements) disposed on the simulation device for actuation of the simulation device, and a recording medium recording the program and capable of being read by the computer also fall within a scope of the present invention.

Effects of the Invention

According to the present invention, the response relative to any input of a servo controller can be confirmed through simulation, and thus when the control parameter is set every time in order to confirm the response of the controlled object, the motor is not required to be actually driven to measure the response of the controlled object. Therefore, the adjusting time is shortened.

Besides, the time response is output by using a response result, i.e., the frequency response function, obtained by actually driving a driving part, therefore, the simulation can be performed with a better precision.

BRIEF DESCRIPTION OF THE DRAWINGS

FIGS. 8a to 8d are block diagrams illustrating a simulation system, FIG. 8a is a diagram illustrating a basic structure of the simulation system, FIG. 8b is a diagram when all control blocks of the simulation system are replaced with a frequency transfer function for simulation, FIG. 8c is a diagram when a model velocity controller, a model current controller and a mechanical model part of the simulation system are replaced with a frequency transfer function for simulation, and FIG. 8d is a diagram when a model current controller and a mechanical model part of the simulation system are replaced with a frequency transfer function for simulation.

FIG. 12a is a block diagram illustrating a control structure of a servo controller having a feedforward device, FIG. 12b is a diagram illustrating a simulation system having a model feedforward device and FIG. 12c is a diagram explaining simulation having a model feedforward device.

FIGS. 14a to 14d are diagrams explaining simulation of velocity control, FIG. 14a is a block diagram illustrating a control structure of a servo driver during velocity control, FIG. 14b is a diagram illustrating of a simulation system during simulation of velocity control, FIG. 14c is a diagram when a model velocity controller, a model current controller and a mechanical model part of the simulation system are replaced with a frequency transfer function for simulation, and FIG. 14d is a diagram when a model current controller and a mechanical model part of the simulation system are replaced with a frequency transfer function for simulation.

FIG. 15a is a block diagram of a control structure of a servo driver during torque control, FIG. 15b is a diagram illustrating the structure of a simulation system during torque control simulation, and FIG. 15c is a diagram when a model current controller and a mechanical model part of the simulation system are replaced with a frequency transfer function for simulation.

DESCRIPTION OF THE EMBODIMENTS

Embodiment 1

[Summary of Control System 100]

Figure 1:
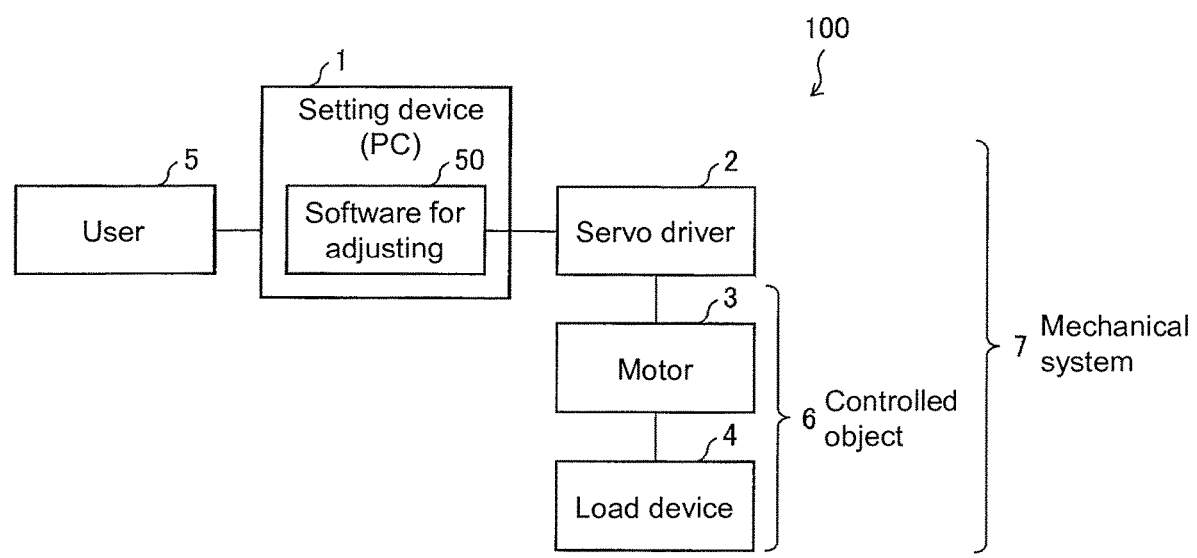
FIG. 1 is a diagram illustrating a control system of the present embodiment.

Hereinafter, embodiment 1 is explained based on FIGS. 1-9. At first, the control system 100 of the present embodiment is explained with reference to FIG. 1. FIG. 1 is a diagram illustrating summary of the control system 100. The control system 100 uses a servo mechanism to control a load device 4 to actuate, and as shown in FIG. 1, comprises a setting device (simulation device) 1, a servo driver (motor controller) 2, a motor (driving part) 3 and the load device 4. Besides, the motor 3 and the load device 4 are together called as a controlled object 6, and the controlled object 6 and the servo driver 2 are called together as a mechanical system 7.

The setting device 1 is configured to set and adjust control parameters of the servo controller 2 and contains adjusting software 50. Specifically speaking, the setting device 1 uses the adjusting software 50 to adjust the control parameters (for example, position gain, velocity gain, cut off frequency of a filter, etc.) of the servo driver 2 such that a response state of the servo driver 2 is optimal. In addition, the adjusting software 50 has a function of measuring the response state of the servo driver 2 and a function of simulating a response of the servo driver 2. The setting device 1 for example is realized by means of a personal computer, and by executing a program (adjusting software 50) stored in the personal computer, the computer is used as the setting device 1 for playing a role.

A user (a user, setter and the like of the control system 100) 5 uses the setting device 1 to set and adjust the control parameters of the servo driver 2. That is, the user 5 uses the adjusting software 50 on the setting device 1 to set and adjust the control parameters of the servo driver 2, such that the response state of the servo driver 2 is optimal. In other words, an actual measuring result and simulation result are used to confirm the response state and adjust the control parameters.

The servo driver 2 stores the control parameters set and adjusted by the setting device 1 and drives the motor 3 according to the control parameters to actuate the load device 4. Besides, the servo driver 2 is connected to the setting device 1 and the motor 3 in a wired or wireless communicating manner. For example, the servo driver 2 is connected to the setting device 1 through a Universal Serial bus (USB) cable. Besides, the servo driver 2 and the motor 3 are connected by for example a special cable.

Besides, in the present embodiment, a measured object is actually measured to obtain a frequency response function, and inverse Fourier transform is performed on a frequency transfer function obtained according to the frequency response function and the control parameters to compute the impulse response, which is used to execute simulation.

Therefore, unlike the condition of preparing a model of the controlled object as a physical model and using the model, the simulated controlled object is limited to a form of the model or times. Therefore, a range of the simulated object is expanded, and the phenomenon that the precision of a simulation result is reduced caused by deviation of the actual controlled object from the form of the physical model can be prevented. Further, the response result can be confirmed without a need to have the knowledge related to the control parameters of the servo driver, and the user is not required to have much knowledge.

[Details of the Setting Device 1 and the Servo Driver 2]

Figure 2:
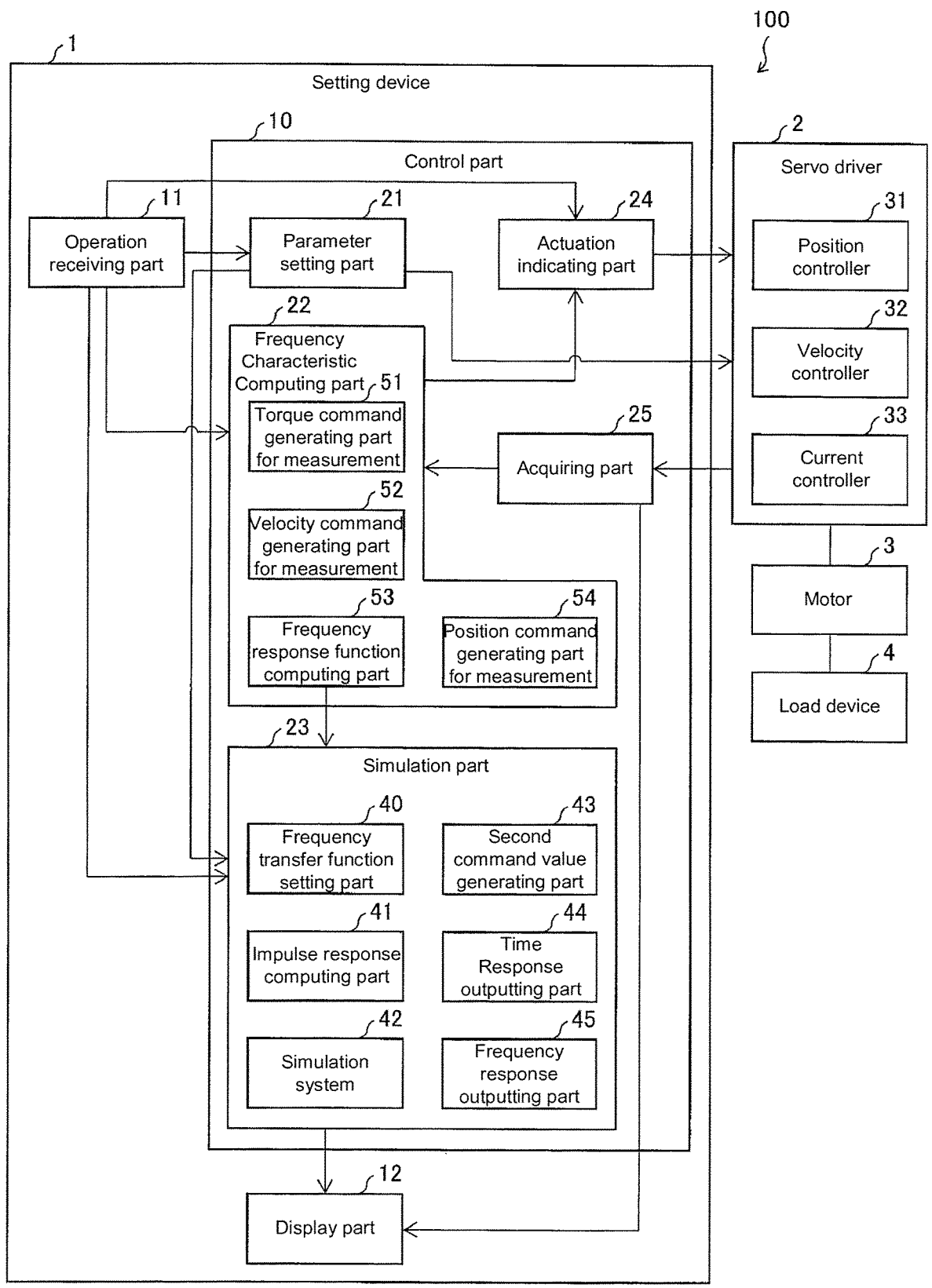
FIG. 2 is a function block diagram illustrating an internal structure of the control system.
Figure 3:
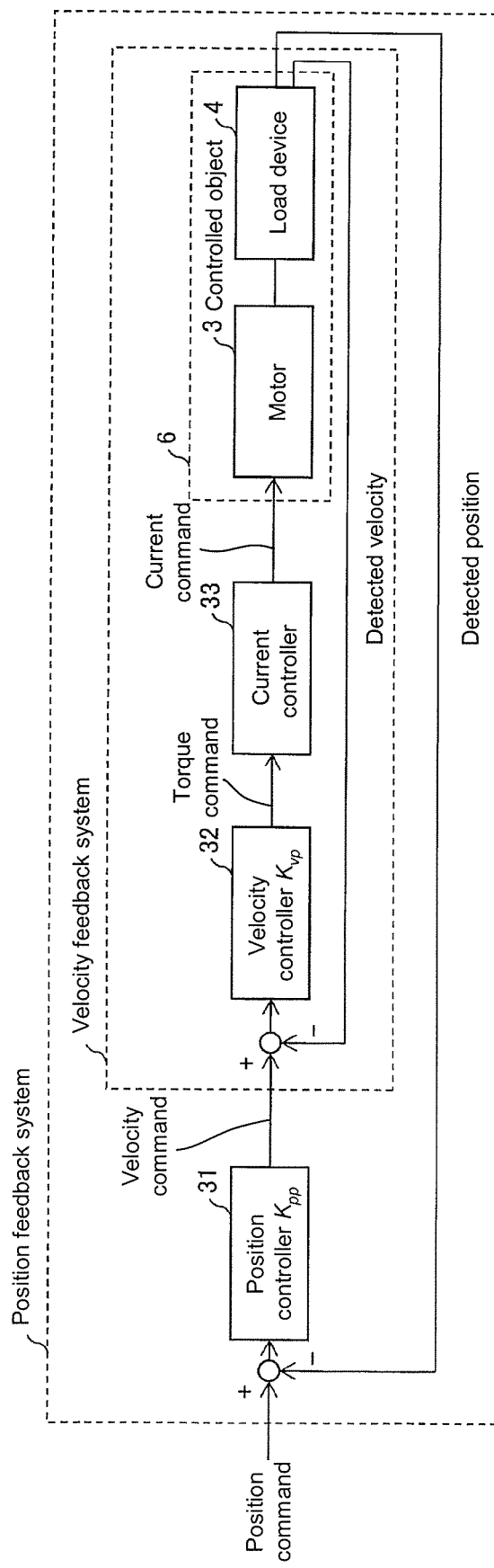
FIG. 3 is a block diagram of a control system of a servo driver.

Then, the constitution of the setting device 1 and the servo driver 2 is explained with reference to FIGS. 2 and 3, FIG. 2 is a block diagram illustrating the constitution of main parts of the setting device 1 and the servo driver 2 contained in the control system 100. Besides, FIG. 3 is a diagram illustrating the structure of control in the servo driver 2.

As shown in FIG. 2, the setting device 1 contains a control part 10, an operation receiving part 11 and a display part 12.

The operation receiving part 11 receives an operation on the setting device 1, and notifies the control part 1o of an operation content. The operation receiving part 11 can contain hardware such as a keyboard and a mouse and can also be matched with a display part 12 mentioned below to contain a touch panel.

Besides, the operation receiving part 11 is used to receive an input value executing the simulation mentioned below, and can also receive some indications instead of the input value, and generate the input value (second command value) in the simulation part 23 according to a received content. At this point, the simulation part 23 becomes a second command value generating part.

The display part 12 displays a setting picture, a simulation result, etc., setting the control parameters of the servo driver 2. In addition, the display part 12 may be not a necessary structure in the setting device 1 and can be located outside the setting device 1. Besides, the display part 12 can, like aforesaid, be constituted as the touch panel containing the functions of the operation receiving part.

The control part 10 executes various processing, comprising simulation of the response of the mechanical system 7 containing the servo driver 2, setting of the parameters of the servo driver 2, etc., in the setting device 1, and the control part 10 contains a parameter setting part 21, a frequency characteristic computing part 22, a simulation part 23, an actuation indicating part 24 and an acquiring part 25.

The parameter setting part 21 sets the control parameters, received by the operation receiving part 11, of the servo driver 2 to the servo driver 2. Besides, during simulation execution, the simulation part 23 is notified of the control parameters, received by the operation receiving part 11, of the servo driver 2.

The frequency characteristic computing part 22 computes a frequency response function as the characteristics of the controlled object 6 containing the load device 4 when the simulation of the mechanical system 7 containing the servo drive 2 is executed by the simulation part 23 mentioned below. The simulation part 23 is notified of the computed result. The details of the computing method of the frequency response function of the controlled object 6 are mentioned below.

The simulation part 23 uses the frequency response function, computed by the frequency characteristic computing part 22, of the controlled object 6 containing the load device 4 to simulate a response (the time response and position response) of the mechanical system 7 containing the servo driver 2 and displays the result on the display part 12. The details that the simulation part 23 performs the simulation are explained below.

The actuation indicating part 24 sends an actuation indication to the servo driver 2 according to an indication received by the operation receiving part from the user. Specifically speaking, the servo driver 2 is notified of a position command (command of a designated moment and designated position) received by the operation receiving part 11 to indicate the controlled object to arrive at the designated position in the designated moment in the load device 4.

The acquiring part 25 measures a result when the load device 4 is actually operated and notifies the frequency characteristic computing part 22 or display part 12. Speaking in more detail, when the load device 4 is actuated by the indication of the frequency characteristic computing part 22, the acquiring part 25 notifies a measurement result to the frequency characteristic computing part 22. Besides, when the load device 4 is actuated by the indication of the frequency characteristic computing part 22, the acquiring part 25 displays the result on the display part 12.

Besides, as shown in FIG. 2, the servo driver 2 contains a position controller 31, a velocity controller 32 and a current controller 33. The processing content of these controllers is explained with reference to FIG. 3. FIG. 3 is a diagram illustrating a control structure of the servo driver 2.

As shown in FIG. 3, the position controller 31 for example performs Proportion (P) control. Specifically speaking, by multiplying a deviation, i.e., a position deviation, between a position command notified from the actuation indicating part 24 and a detected position by a position proportion gain, a command velocity is output. In addition, the position controller 31 is set by the parameter setting part 21, therefore, a position proportion gain $Kp_{pp}$ exists as a control parameter in advance.

The velocity controller 32 for example performs P control. Specifically speaking, by multiplying a deviation, i.e., a velocity deviation, between a velocity command output from the position controller 31 and a detected velocity by a velocity proportion gain, a command torque is output. In addition, the velocity controller 32 is set by the parameter setting part 21, therefore, a velocity proportion gain $K_{vp}$ exists as a control parameter in advance. In addition, the velocity controller 32 can also be subjected to Proportional Integration (PI) control rather than P control. At this point, the velocity controller 32 has a velocity proportion gain $K_{vp}$ and a velocity integration gain $K_{vi}$ as the control parameter.

The current controller 33 outputs a current command based on a torque command output from the velocity controller 32, and the motor 3 is controlled to actuate the load device 4. The current controller 33 contains a torque command filter (once low pass filter) and a plurality of notch filters, and there are cut off frequency of the torque command filter and the frequency of the notch filters as the control parameters.

The system containing the velocity controller 32, the current controller 33 and the controlled object 6 as well as a feedback of the detected velocity to the velocity controller 32 is called as a velocity feedback system, and the system containing the position controller 31 and also containing the feedback of the detected position to the position controller 31 except for the velocity feedback system is called as a position feedback system. Besides, they are called as a feedback system when there is not need to distinguish the velocity feedback system and the position feedback system.

[Details of the Processing in the Frequency Characteristic Computing Part 22]

Figure 5:
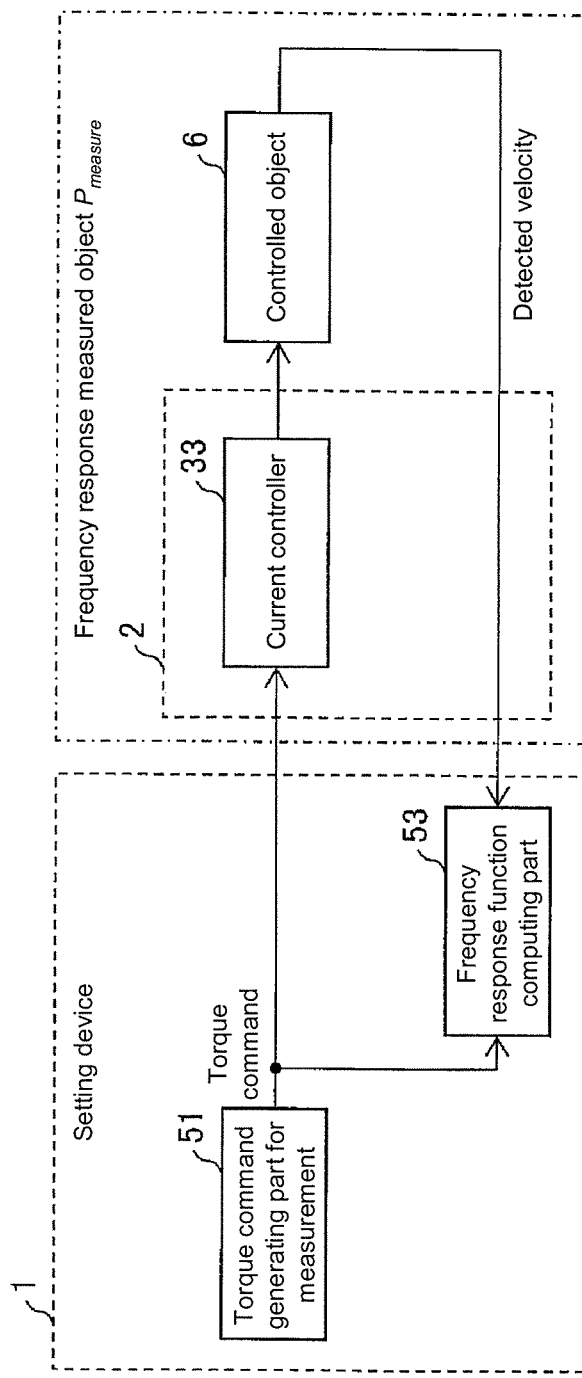
FIG. 5 is a control block diagram of computing a frequency response function according to a torque command for measurement.
Figure 6:
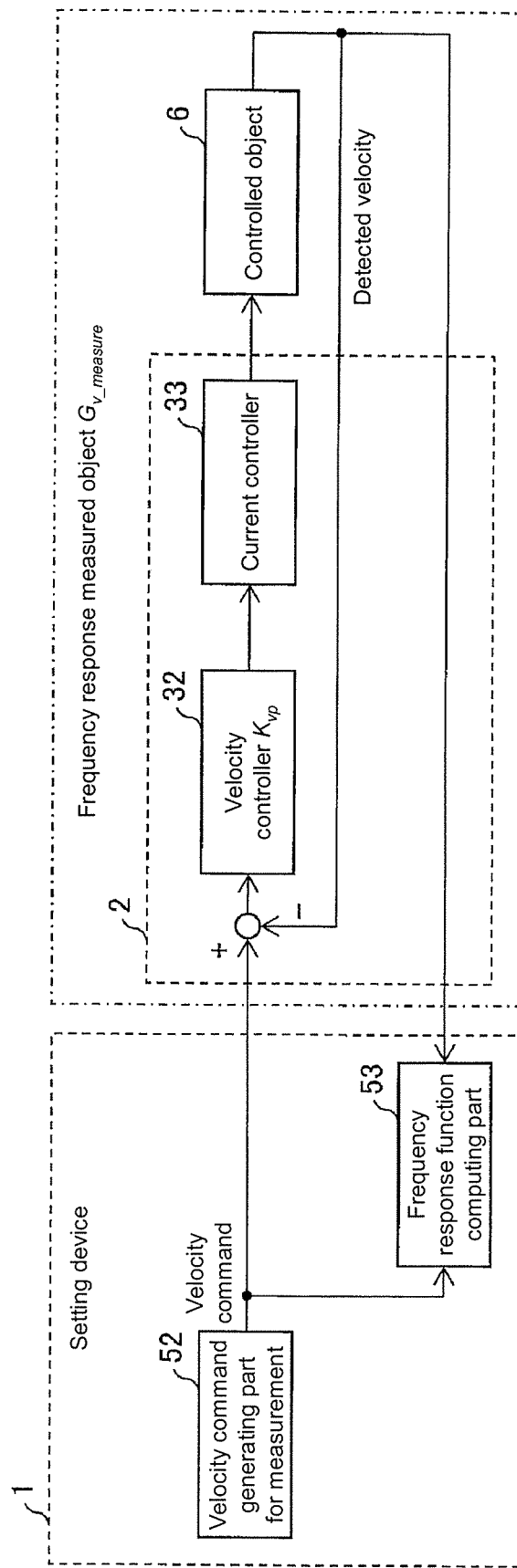
FIG. 6 is a control block diagram of computing a frequency response function according to a velocity command for measurement.
Figure 7:
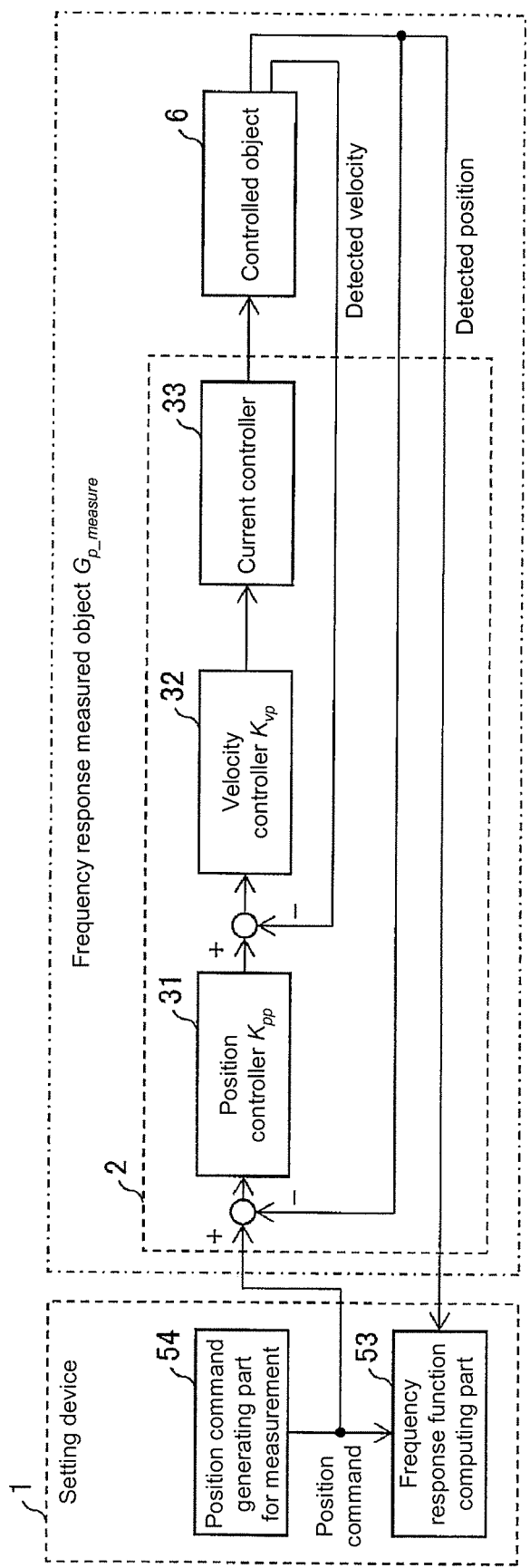
FIG. 7 is a control block diagram of computing a frequency response function according to a position command for measurement.

The details of the processing in the frequency characteristic computing part 22 are explained with reference to FIGS. 5-7. FIG. 5 is a control block diagram when the frequency response function is computed according to the torque command for measurement. FIG. 6 is a control block diagram when the frequency response function is computed according to the velocity command for measurement. FIG. 7 is a control block diagram when the frequency response function is computed according to the position command for measurement.

As shown in FIG. 2, the frequency characteristic computing part 22 contains a torque command generating part 51 for measurement, a velocity command generating part 52 for measurement, a frequency response function computing part 53 and a position command generating part 54 for measurement, and in addition, can also comprise any one or two of the torque command generating part 51 for measurement, the velocity command generating part 52 for measurement and the position command generating part 54 for measurement without needing all of them.

The torque command generating part 51 for measurement generates a torque command for measurement (first command value and torque command value) for driving the motor when the frequency response function of the controlled object 6 containing the load device 4 is solved.

The velocity command generating part 52 for measurement generates a velocity command for measurement (first command value and velocity command value) for driving the motor when the frequency transfer function P of the controlled object 6 containing the load device 4 is solved.

The position command generating part 54 for measurement generates a position command for measurement (first command value and position command value) for driving the motor when the frequency transfer function P of the controlled object 6 containing the load device 4 is solved.

In addition, the present embodiment records the following constitution, that is, the setting device 1 has a torque command generating part 51 for measurement, a velocity command generating part 52 for measurement and a position command generating part 54 for measurement as a function of generating a command value for measuring frequency response. However, the generating method of the command value for measuring the frequency response is not limited thereto. For example, the torque command generating part 51 for measurement, the velocity command generating part 52 for measurementand the position command generating part 54 for measurementcan respectively set conditions for generating the command value, and the generation of the command value is performed by the servo driver 2 through notifying the servo driver 2 of the set conditions. As the conditions of generating the command value, for example, when a scan sine wave is used as the command value, an initial amplitude and an amplification rate of the amplitude of the command values can be listed. Besides, a value which can decide a maximum of the frequency of the command value can be set as the condition. The value deciding the maximum of the frequency of the command value for example can be a measured sampling period. The generating conditions of the command values are set by the user through the operation receiving part 11.

The frequency response function computing part 53 calculates the characteristics, i.e., the frequency response function, of the controlled object 6 containing the load device 4 by using the torque command for measurement, the velocity command for measurement or the position command for measurement generated by the torque command generating part 51 for measurement, the velocity command generating part 52 for measurement or the position command generating part 54 for measurement. A detailed computing method is explained as follows.

[Computing Method-1]

At first, the computing method-1 is explained with reference to FIG. 5. As shown in FIG. 5, in the computing method-1, at first, the torque command generating part 51 for measurement generates a torque command for measurement containing a plurality of frequency components, and notifies the current controller 53 and the frequency response function computing part 53. Then, the current controller 33 drives the motor 3 based on the notified torque command for measurement to actuate the load device 4.

Then, the frequency response function computing part 53 computes the frequency response function of the controlled object 6 containing the load device 4 according to the torque command for measurement notified from the torque command generating part 51 for measurement and a response velocity (detected velocity (velocity measured value and measured value)) in the controlled object 6 containing the load device 4. That is, a measured object $P_{measure}$ of the frequency response function is a block containing the current controller 33 and the controlled object 6.

Specifically speaking, the frequency characteristic computing part 22 computes the frequency response function as mentioned below. At first, as shown below, the torque command for measurement and the measured response velocity data (time sequence arrangement of the sampling interval Δt and a data number N) are subjected to frequency analysis (Fourier transform) respectively and a ratio thereof is solved, thus computing the frequency response function P (complex number arrangement).

Tref[N]: complex number arrangement obtained by performing Fourier transform on the torque command for measurement Ωact[N]: complex number arrangement obtained by performing Fourier transform on the response velocity $$P[N]=\Omega act[N]/Tref[N]$$

$$f[N]=0,1/(\Delta t\cdot N),2/(\Delta t\cdot N),3/(\Delta t\cdot N),\ldots,(N-1)/(\Delta t\cdot N)\ f:\ \text{frequency}$$

According to the above, the frequency response function of a measured object $P_{measure}$ containing the current controller 33 and the controlled object 6 is solved.

[Computing Method-2]

Next, the computing method-2 is explained with reference to FIG. 6. As shown in FIG. 6, in the computing method-2, at first, the velocity command generating part 52 for measurement generates a velocity command for measurement containing a plurality of frequency components and notifies the velocity controller 52 and the frequency response function computing part 53. Next, the velocity controller 32 as abovementioned outputs a command torque according to a deviation, i.e., a velocity deviation between the velocity command for measurement and the detected velocity. The current controller 33 actuates the load device 4 based on the notified command torque.

Then, the frequency response function computing part 53 computes the frequency response function of a measured object $G_{v\_measure}$ according to the velocity command for measurement notified by the velocity command generating part 52 for measurement and the measured response velocity (detected velocity) in the load device 4. The measured object $G_{v\_measure}$ is a block containing the velocity controller 32, the current controller 33 and the controlled object 6.

Specifically speaking, the frequency characteristic computing part 22 as mentioned below firstly performs frequency analysis (Fourier transform) on the velocity command for measurement and the measured response velocity data (time sequence arrangement of the sampling interval Δt and a data number N) respectively and a ratio thereof is solved, thus computing a velocity closed frequency response function $G_{v\_closed}$ (complex number arrangement).

Ωref[N]: complex number arrangement obtained by performing Fourier transform on the velocity command for measurement Ωact[N]: complex number arrangement obtained by performing Fourier transform on the response velocity $$G_{v\_closed}[N]=(\Omega act[N])/(\Omega ref[N])$$

$$f[N]=0,1/(\Delta t\cdot N),2/(\Delta t\cdot N),3/(\Delta t\cdot N),\ldots,(N-1)/(\Delta t\cdot N)\ f:\ \text{frequency}$$

Next, as shown below, according to the velocity closed characteristic $G_{v\_closed}$, the characteristic ($C_v$) of the velocity controller 32 of the servo driver 2 during measuring is subjected to division operation, thus solving a frequency response function P of the measured object $G_{v\_measure}$.

$$G_{v\_open}[N]=(G_{v\_closed}[N])/(1-G_{v\_closed}[N])$$

$$P[N]=(G_{v\_open}[N])/C_v[N]$$

By the abovementioned, the frequency response function P of the measured object $G_{v\_measure}$ is solved.

[Computing Method-3]

Next, the computing method-3 is explained with reference to FIG. 7. As shown in FIG. 7, in the computing method-3, at first, the position command generating part 54 for measurement generates a position command for measurement containing a plurality of frequency components and notifies the position controller 31 and the frequency response function computing part 53. Next, the position controller 31 outputs a command torque according to a deviation, i.e., a position deviation between the position command for measurement and the detected position. The velocity controller 32 outputs a command torque according to a deviation, i.e., a velocity deviation between the command velocity and the detected velocity. The current controller 33 actuates the load device 4 based on the notified command torque.

Then, the frequency response function computing part 53 computes the frequency response function of a measured object $G_{p\_measure}$ according to the position command for measurement notified from the position command generating part 54 for measurement and the measured response position (detected position (position measured value and measured value)) in the load device 4. The measured object $G_{p\_measure}$ is a block containing the position controller 31, the velocity controller 32, the current controller 33 and the controlled object 6.

Specifically speaking, the frequency characteristic computing part 22 as mentioned below firstly performs frequency analysis (Fourier transform) on the position command for measurement and the measured response position data (time sequence arrangement of the sampling interval Δt and a data number N) respectively and a ratio thereof is solved, thus computing a position closed frequency response function $G_{p\_closed}$ (complex number arrangement).

Θref[N]: complex number arrangement obtained by performing Fourier transform on the position command for measurement Θact[N]: complex number arrangement obtained by performing Fourier transform on the response position $$G_{p\_closed}[N]=(\Theta act[N])/(\Theta ref[N])$$

$$f[N]=0,1/(\Delta t \cdot N),2/(\Delta t \cdot N),3/(\Delta t \cdot N), \ldots ,(N-1)/(\Delta t \cdot N)$$
$f$:frequency Next, as shown below, the position open characteristic $G_{p\_open}$ is solved according to the position closed characteristic $G_{p\_closed}$.

$$G_{p\_open}[N]=(G_{p\_closed}[N])/(1-G_{p\_closed}[N])$$

Then, as shown below, the characteristic $C_p$ of the position controller 31 is solved according to the value of the control parameter during measuring.

Besides, according to the position open characteristic $G_{p\_open}$, the characteristic of the position controller 31 and the integration item (1/s) are subjected to division operation to solve the velocity closed characteristic.

$$G_{v\_closed}[N]=(G_{p\_open}[N])/(C_p/s)$$

Next, as shown below, according to the velocity closed characteristic $G_{v\_closed}$, the characteristic ($C_v$) of the velocity controller of the servo driver 2 during measuring is subjected to division operation, such that the frequency response function P of the measured object $G_{v\_measure}$ is measured.

$$G_{v\_open}[N]=(G_{v\_closed}[N])/(1-G_{v\_closed}[N])$$

$$P[N]=(G_{v\_open}[N])/C_v[N]$$

As abovementioned, the frequency response function P of the measured object $G_{pv\_measure}$ is solved.

In this way, in the present embodiment, a measurement result obtained by actuating the load device 4 is used to solve the frequency response function of the measured object containing the load device 4. Besides, the frequency response function used to execute the simulation as follows, therefore, high prevision simulation can be executed. Besides, the characteristics (frequency response function) of the measured object containing the load device 4 can be solved according to the measurement result, therefore, the user 5 can execute simulation without the need to have special knowledge for solving the characteristics of the load device 4.

[Detailed of Processing in Simulation Part 23]

Next, the details of the processing in the simulation part 23 are explained with reference to FIGS. 8a to 8d, which are diagrams explaining a simulated content in the setting device 1 of the present embodiment.

As shown in FIG. 2, the simulation part 23 comprises a frequency transfer function setting part 40, an impulse response computing part 41, a simulation system 42, a second command value generating part 43, a time response outputting part 44 and a frequency response outputting part 45.

The frequency transfer function setting part 40 sets a frequency transfer function used for simulation, i.e., the frequency transfer function for simulation according to the frequency response function computed according to the frequency response function computing part 53 or based on the frequency response function or the control parameter for simulation.

The impulse response computing part 41 computes an impulse response of the frequency transfer function for simulation set by the frequency transfer function 40.

The simulation system 42 is a system containing a model structure of a simulation object. Details of the simulation system 42 are mentioned below.

The second command value generating part 43 generates a command value for simulation, i.e., the second command value.

The time response outputting part 44 executes time response simulation and outputs a time response as a simulation result.

The frequency response outputting part 45 outputs a frequency response as the simulation result.

[Basic Structure of the Simulation System]

At first, the basic structure (control block structure) of the simulation system is explained with reference to FIG. 8a. As shown in FIG. 8a, the basic structure of the simulation system corresponds to the mechanical system 7 and contains a model position controller 31', a model velocity controller 32', a model current controller 33' and a mechanical model part 34'.

The model position controller 31' corresponds to the position controller 31 of the servo driver 2, the model velocity controller 32' corresponds to the velocity controller 32 of the servo driver 2, the model current controller 33' corresponds to the current controller 33 of the servo driver 2 and the mechanical model part 34' corresponds to the controlled object 6.

In the basic structure of the simulation system, similar to the servo driver 2, a position command $p_{cmd}$ is input to the model position controller 31' to output a velocity command $v_{cmd}$, a velocity command $c_{cmd}$ is input to the model velocity controller 32' to output a torque command $\tau_{cmd}$, and a torque command is input to the model current controller 33' to output a current command $c_{cmd}$. Besides, a current command is input to the mechanical model part 34' to output a velocity $v_{sim}$ and a position $p_{sim}$ as the simulation result.

[Simulation-0]

In simulation-0, as shown in FIG. 8b, a whole (the model position controller 31', the model velocity controller 32', the model current controller 33' and the mechanical model part 34') of the basic structure as shown in FIG. 8a is used as an object (first frequency transfer function) of inverse Fourier transform for simulation. The specific condition is as follows.

At first, by the processing of the frequency characteristic computing part 22, the frequency response function P of the controlled object 6 containing the load device 4 is solved. Next, the frequency transfer function ($C_p$, $C_v$) as the characteristics of the controller is multiplied by the frequency response function P of the controlled object 6, such that the velocity open frequency transfer function $G_{v\_open}$ and the velocity closed frequency transfer function $G_{v\_closed}$ are solved. Herein, the frequency transfer function ($C_p$, $C_v$) is expressed by the control parameters for simulation. That is, the frequency transfer function $C_p$ is a frequency transfer function expressing the characteristics of the model position control part 31' of the simulation system, and a position proportion gain $K_{pp\_sim}$ for simulation as the control parameter for simulation is set. That is, the frequency transfer function $C_p$ is a function becoming a constant number. Besides, the frequency transfer function $C_v$ is a frequency transfer function expressing the characteristics of the model velocity control part 32' of the simulation system, and a velocity proportion gain $K_{vp\_sim}$ for simulation as the control parameter for simulation is set. Besides, when the model velocity control part 32' performs PI control, in the model velocity control part 32', the frequency transfer function $C_v$ is expressed also by a velocity integration gain $K_{vi\_sim}$ expect for the velocity proportion gain $K_{vp\_sim}$. At this point, the frequency transfer function $C_v$ is expressed as $K_{vp\_sim} \times (1+K_{vi\_sim}/2)$ (a function of a Laplace operator s). Further, the position open frequency transfer function $G_{p\_open}$ and the position closed frequency transfer function $G_{p\_closed}$ are solved.

$$G_{v\_open} = C_v \cdot P$$

$$G_{v\_closed} = (G_{v\_open})/(1+G_{v\_open})$$

$$G_{p\_open} = C_p \cdot G_{v\_closed} \cdot 1/s \text{ (}s\text{ is a variable of the transfer function)}$$

$$G_{p\_closed} = (G_{p\_open})/(1+G_{p\_open})$$

Next, the position closed frequency transfer function $G_{p\_closed}$ is subjected to inverse Fourier transform to solve an impulse response $g_{imp}$, which expresses a position response relative to a position impulse command.

$$g_{imp} = IFFT(G_{p\_closed})$$

Next, the position response (time sequence arrangement $p_{sim}$) relative to the position command (time sequence arrangement $p_{cmd}$) is solved through the following computing. In addition, it is a convolution performing the impulse response $g_{imp}$.

---
FOR repeating m=0 to a length quantity to be simulated DO
    FOR merely repeating n=0 to a length quantity of $g_{imp}$ (N) DO
        $p_{sim}[m+n] = p_{sim}[m+n] + p_{cmd}[m] \cdot g_{imp}[n]$
    END FOR
    END FOR

---

Through the abovementioned, the whole of the basic structure as shown in FIG. 8a is replaced with the frequency transfer function for simulation.

Therefore, the control parameters are changed while the response (position response and time response) of the mechanical system 7 is obtained, such that the motor 3 is actually driven to actuate the load device 4 for confirming the response every time when the control parameter is changed every time.

[Simulation-1]

In simulation-1, compared with the simulation-0, the following aspect is more excellent.

In the frequency response function of the controlled object 6 containing the load device 4 solved by the frequency characteristic computing part 22 according to a detected result, low frequency information is not fully contained. Therefore, time sequence data solved by performing inverse Fourier transform on the computed result will more errors in low frequency components. Specifically, a direct current component is displayed as a constant deviation, therefore, obvious errors are caused. In addition, by prolonging the measurement time, more low frequency information can be obtained, but ease of use is reduced, and a use case is not ideal.

Besides, in simulation-0, a velocity command $v_{cmd}$ does not occur, and the constitution of the velocity command $v_{cmd}$ plus the velocity feedforward cannot be simulated.

Therefore, in simulation-1, a response position is fed back to calculate a position deviation between a command position and a response position, and the position deviation is used to perform convolution on the impulse response obtained by performing inverse Fourier transform on the frequency transfer function to compute the response velocity, and the computed response velocity is subjected to integration to compute a response position, thereby executing the simulation. Therefore, the position deviation is computed by feeding back the response position, therefore, thus the error of the low frequency components is corrected, and high precision simulation can be executed.

Speaking in more detail, explanation is performed with reference to FIG. 8c. FIG. 8c is a diagram for explaining content of simulation-1. As shown in FIG. 8c, in simulation-1, the model velocity controller 32', the model current controller 33' and the mechanical model part 34' in the basic structure of the simulation system are simulated as an object of the inverse Fourier transform. Besides, the model position controller 31' computes a velocity command $v_{cmd}$ according to a position deviation between a position command $p_{cmd}$, and a response position $p_{sim}$ and uses the second frequency transfer function to compute the response velocity $v_{sim}$ according to the computed velocity command $v_{cmd}$, and computes a response position $p_{sim}$ according to the computed response velocity $v_{sim}$. In addition, herein, the computed velocity command $v_{cmd}$ corresponds to an output value output by inputting the position command pend (second command value) to the simulation system.

Specifically speaking, computing is performed in a following manner. In addition, the characteristic of the model velocity controller 32' to which the parameter to be simulated is input is set into $C_v$.

At first, the frequency transfer function setting part 40 multiplies $C_v$ by the frequency response function P, computed by the frequency characteristic computing part 22, of the controlled object 6 containing the load device 4 to solve the velocity open frequency transfer function $G_{v\_open}$ and the velocity closed frequency transfer function $G_{v\_closed}$.

$$G_{v\_open}[N] = C_v[N] \cdot P[N]$$

$$G_{v\_closed}[N] = (G_{v\_open}[N])/(1+G_{v\_open}[N])$$

Next, the impulse response computing part 41 performs inverse Fourier transform on the velocity closed frequency transfer function $G_{y\_closed}$ to solve the impulse response $g_{imp}$, which represents a velocity response relative to the velocity impulse command.

$$g_{imp}[N]=IFFT(G_{v\_closed}[N])$$

Next, the simulation part 23 solves the position response (time sequence arrangement $p_{sim}$) and the velocity response (time sequence arrangement $v_{sim}$) relative to the position command (time sequence arrangement $p_{cmd}$) by the following computing, which is a convolution performing impulse response $g_{imp}$. In addition, $v_{cmd}$ is output from the model position controller 31'.

```
FOR repeating m=0 to length quantity to be simulated DO
    p_err=p_cmd[m]-p_sim[m-1]... computing a position deviation p_err
    V_cmd=K_pp·P_err
    FOR merely repeating n=0 to a length quantity of g_v-imp (N) DO
        v_sim[m+n]=v_cmd·g_imp[n]...convolution
    ENDFOR
    p_sim[m]=p_sim[m-1]+v_sim[m]·Δt...performing integration on the
velocity to compute a position
ENDFOR
```

Herein, $K_{pp}$ is a position proportion gain (control parameter), and $\Delta t$ is a sampling interval during frequency response measuring.

As abovementioned, in simulation-1, the model velocity controller 32', the model current controller 33' and the mechanical model part 34' in the basic structure as shown in FIG. 8a are taken as the object of inverse Fourier transform, and simulation is executed by using position deviation.

Besides, by using the position deviation, the error of the low frequency components in the frequency response function of the controlled object 6 containing the load device 4 can be reduced, therefore, more accurate simulation can be performed compared with simulation-0.

Besides, the velocity open frequency transfer function ($G_{v\_open}$) and the velocity closed frequency transfer function ($G_{v\_closed}$) are directly taken as a Bode line graph for outputting, therefore, the velocity open or velocity closed frequency response can be simulated.

[Variable Examples]

When the simulation is repeated without changing the parameters of the model velocity controller 32', the velocity closed characteristic (frequency transfer function) $G_{v\_closed}$ is fixed. Therefore, by the aforesaid computing method-2, the velocity closed characteristic (frequency transfer function) $G_{v\_closed}$ is solved, and the solved velocity closed characteristic (frequency transfer function) $G_{v\_closed}$ is used to solve $g_{imp}$ for simulation. It is useful for example only when the parameters of the position controller 31 are changed and only when the position command is changed.

[Processing Flow of Setting Control Parameters in the Setting Device 1]

Figure 4:
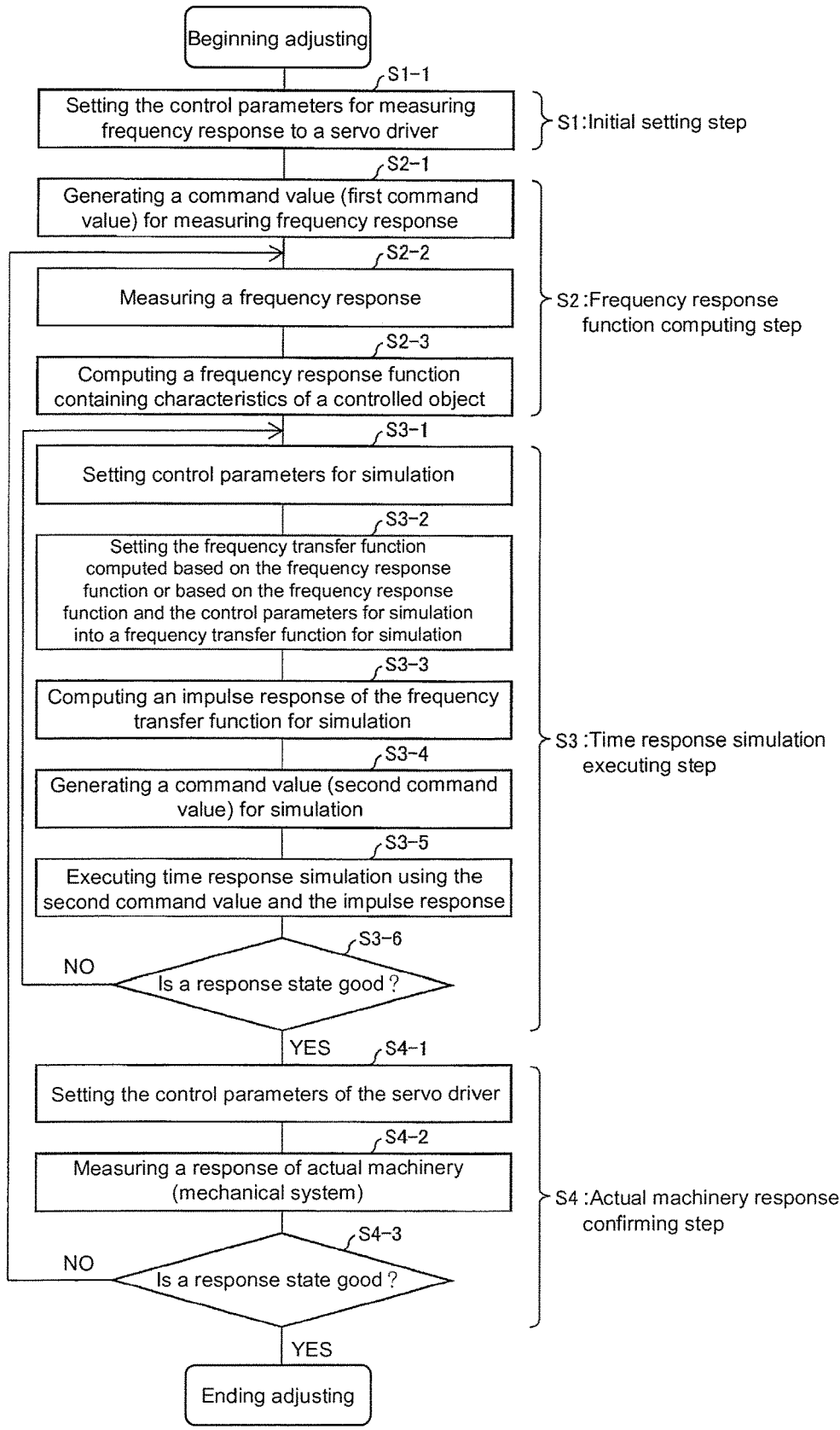
FIG. 4 is a flow chart of a flow of an adjusting method of control parameters.

Next, the processing flow of adjusting (setting) the control parameters in the setting device 1 is explained. FIG. 4 is a flow chart illustrating the processing flow in the setting device 1.

As shown in FIG. 4, in the adjusting processing of the control parameters, as a large flow, initial setting is performed in an initial setting step (S1), the frequency response function is computed in a frequency response function computing step (S2), time response simulation is executed in a time response simulation executing step (S3), and an actual machinery response is confirmed in the actual machinery response confirming step (S4).

In the initial setting step S1, the parameter setting part 21 sets the control parameters for measurement to the servo driver 2 (S1-1).

In the frequency response computing step S2, at first, at least any one of the torque command generating part 51 for measurement, the velocity command generating part 52 for measurement and the position command generating part 54 for measurement generates a command value for frequency response measuring (first command value) (S2-1).

Next, the frequency characteristic computing part 22 measures the frequency response by the acquiring part 25 (S2-2).

Next, the frequency characteristic computing part 22 computes the frequency response function, containing the characteristic of the controlled object 6, of a measured object (S2-3).

In the time response simulation executing step S3, at first, the parameter setting part 21 sets a control parameter for simulation (S3-1).

Next, the frequency transfer function setting part 40 computes a frequency transfer function based on the frequency response function computed in step S2-3 or based on the frequency response function and the control parameter for simulation, and sets into the frequency transfer function for simulation (S3-2).

Next, the impulse response computing part 41 computes an impulse response of the frequency transfer function for simulation in step S3-2 (S3-3).

Next, the second command generating part 43 generates a command value (second command value) for simulation (S3-4).

Next, the time response outputting part 44 uses second command value generated in step S3-4 and the impulse response computed in step S3-3 to execute time response simulation and outputs a result (S3-5).

Figure 9:
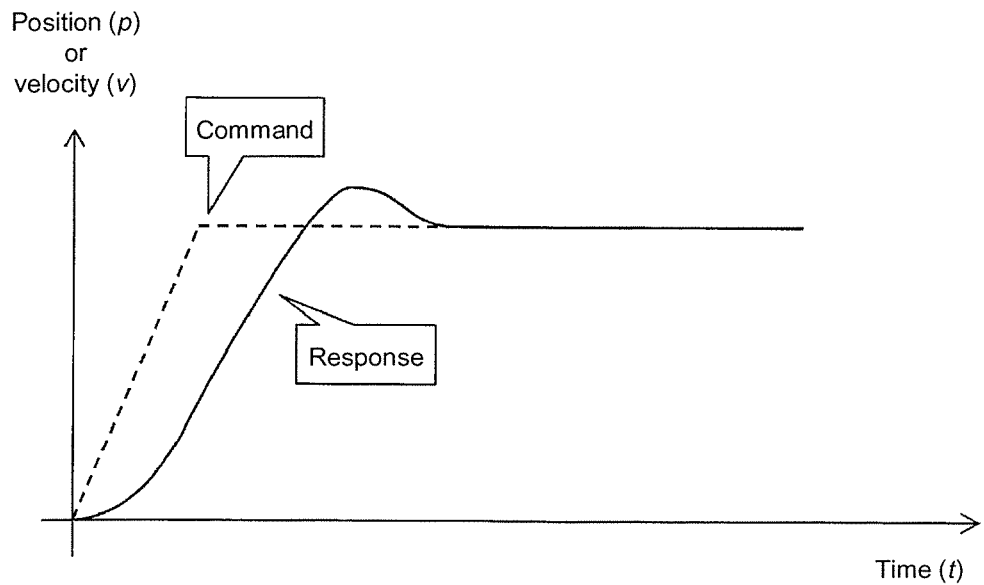
FIG. 9 is a diagram illustrating a display example of a time response simulation result.

The execution result of simulation for example is displayed on the display part 12 in a form as shown in FIG. 9. FIG. 9 is a diagram illustrating a display example of the simulation result. In the example of FIG. 9, by using a chart taking time as an x axis and position (p) or velocity (v) as a y axis, the command (position command and velocity command) and the response result of simulation are overlapped and plotted to be displayed. Therefore, a corresponding relation between the command under the control parameter and the response result can be easily learned.

Besides, if the result of the output time response simulation is better (YES in S3-6), then step S4 is performed, and if not good (NO in S3-6), then step S3 is repeated by returning back to S3-1.

In the actual mechanical response confirming step S4, at first, the control parameter when the response state is judged to be yes in S3-6 is set to the servo driver 2(S4-1).

Next, the mechanical system 7 is actuated by the set control parameter to measure the response (S4-2).

Then, if the measured response is better (YES in S4-3), then the adjusting of the control parameter is ended. On the other hand, if the measured response is not good (NO in S4-3), then step S2-2 is performed.

As abovementioned, in the present embodiment, in order to adjust the control parameter (position gain, velocity gain, cut off frequency of the filter, etc.) of the servo driver 2, the time response of velocity control or position control is simulated and displayed to the user. Therefore, the user 5 can confirm the time response when the set control parameter is used by simulation and can safely adjust in short time without a need to repeatedly adjust the load device 4.

In addition, in the setting processing of the control parameter, the initial response step S1, the frequency response function computing step S2, the time response simulation executing step S3 and the actual machinery response confirming step S4 are set, but even if the actual machinery response confirming step S4 is not performed, the setting processing of the control parameter can still be performed. That is, by using the result simulation obtained by measuring the frequency response of the motor 3 and the load device 4, the simulation of the characteristic of the controlled object 6 can be precisely reflected, therefore, even if the actual machinery response confirming step S4 is not performed, the setting of the control parameter can still be finished.

Embodiment 2

[Simulation-2]

Another embodiment of the present invention is explained as follows based on FIG. 8d. In addition, in order to facilitate explanation, the members with the same functions as the members explained in the embodiment are marked with the same signs and the explanation is omitted.

As shown in FIG. 8d, in the present embodiment, the model current controller 33' and the mechanical model part 34' in the basic structure of simulation are replaced with a frequency transfer function (third frequency transfer function) for simulation to execute simulation.

That is, in simulation-2, the response position is fed back to the model position controller 31' by a model position feedback loop 31b' to compute a position deviation between a position command $p_{cmd}$ and a model response position $p_{sim}$, and the model position controller 31' uses the position deviation to generate a velocity command $V_{cmd}$. Then, the model velocity controller 32' generates a torque command $\tau_{cmd}$ according to a velocity deviation between the velocity command and a model response velocity ($v_{sim}$) fed back by the model velocity feedback loop 32b'. Then, the response velocity is computed according to the torque command and the third frequency transfer function, the computed response velocity is subjected integration to compute the response position, thereby performing simulation. Therefore, the feedback response velocity and the response position are used to compute the velocity deviation and the position deviation, therefore, the error of the low frequency components is reduced, and high prevision simulation can be performed.

In addition, the system containing the model velocity controller 32', the third frequency transfer function P (35c') and the model velocity feedback loop 32b' is called as model velocity feedback system (model feedback system) 32a'. Besides, the system containing the model velocity feedback system 32a', the model velocity controller 32' and the model position feedback loop 31b' is called as a model position feedback system (model feedback system) 31a'.

Specifically speaking, the simulation execution method is as follows. The simulation part 32 performs inverse Fourier transform on the frequency transfer function P in the following way to solve the impulse response $g_{imp}$, which represents a velocity response of the torque impulse command.

$$G_{imp}[N]=IFFT(P[N])$$

Next, the simulation part 23 solves the position response (time sequence arrangement $p_{sim}$) and the velocity response (time sequence arrangement) $v_{sim}$ relative to the position command (time sequence arrangement $p_{cmd}$), which is a convolution performing impulse response $g_{imp}$. In addition, $v_{cmd}$ is output from the model position controller 31', and $\tau_{cmd}$ is output from the model velocity controller 32'.

```
FOR repeating m=0 to a length quantity to be simulated DO
    p_err=p_cmd[m]-P_sim[m-1]...the position deviation p_err is calculated.
    V_cmd=K_pp·P_err
    V_err=V_cmd-V_sim[m-1]...the velocity deviation v_err is calculated.
    T_cmd=K_vp·V_err
    FOR only repeating n=0 to a length quantity of g_v_imp DO
        v_sim[m+n]=τ_cmd·g_imp[n]...convolution
    ENDFOR
    p_sim[m]=psim[m-1]+V_sim[m]·Δt... the velocity is
subjected to integration to compute a position
ENDFOR
```

Herein, same as the embodiment 1, $K_{pp}$ is a position proportion gain (control parameter), $\Delta t$ is a sampling interval during frequency response measuring, and $K_{vp}$ is a velocity proportion gain (control parameter).

As abovementioned, in the present embodiment, the frequency transfer function (P) of the model current controller 33' and the mechanical model part 34' in the basic structure of the simulation system is taken as an object of inverse Fourier transform, and the position deviation and velocity deviation are used to execute simulation.

Besides, by using the position deviation and the velocity deviation, the error of the low frequency components contained in the frequency transfer function P is reduced, therefore, more accurate simulation can be executed compared with simulation-0.

Further, compared with simulation-1, the following effect is achieved. The constitution containing torque feedforward (for the model current controller 33', and the torque command plus the feedforward is taken as input) can be simulated. This is because in simulation-1, no torque command $\tau_{cmd}$ occurs, and thus the torque command $\tau_{cmd}$ cannot be added to the torque feedforward. In addition, the constitution of the feedforward is recorded in the following text as a third embodiment.

Besides, when the simulation when the control parameter of the model current controller 33' is not changed and only the control parameter of the model position controller 31' and that of the model velocity controller 32' is executed, since P (frequency transfer function of the system containing the model current controller 33' and the mechanical model part 34') is not changed, therefore, a handling capacity is reduced. This is because the inverse Fourier transform with a large computing amount is not required to be recomputed.

[Advantages of Simulation-1 Relative to Simulation-2]

Herein, the advantages of simulation-1 relative to simulation-2 are explained with reference to FIG. 10, FIG. 11a and FIG. 11b, which are diagrams for explaining the advantages of simulation-1.

Figure 10:
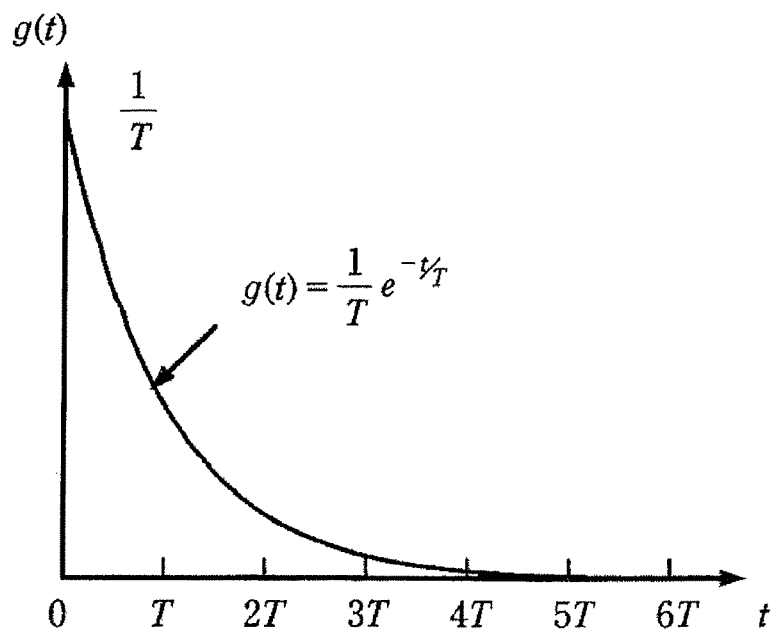
FIG. 10 is a diagram illustrating a general impulse response of once delay factor.
Figure 11A:
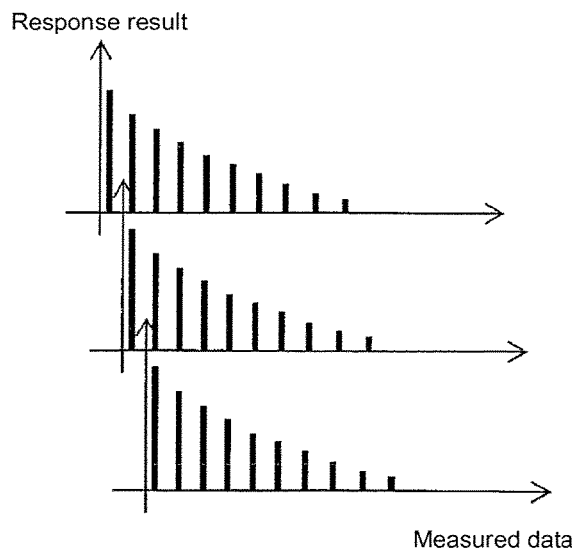
FIGS. 11a and 11b are diagrams for explaining the advantages of simulation-1 relative to simulation-2.
Figure 11B:
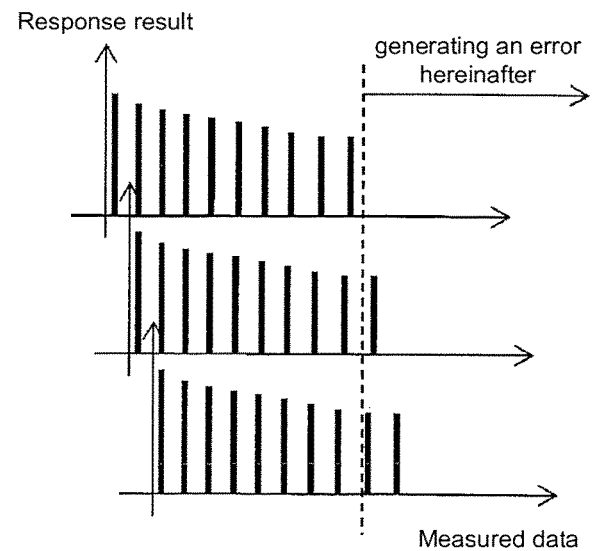

FIG. 10 is a diagram illustrating the impulse response of a general once delay factor. In FIG. 10, the impulse response is converged along with time.

Herein, if P is simply set to be equal to $1/(Js+D)$, (inertia J, single inertia of viscous friction coefficient D), then $$P=1/(Js+D) \rightarrow \text{time constant } J/D \qquad \text{Simulation-2:}$$

$$G_{v\_closed}=C_v·P/(1+C_v·P)=K_{vp}/(Js+D+K_{vp}) \rightarrow \text{time constant } J/(D+K_{vp}). \qquad \text{Simulation-1:}$$

Therefore, the time constant of simulation-2 is larger. Therefore, the time till the convergence of the impulse response is prolonged. Therefore, the following condition may be caused, that is: at the moment of a data number N, under the condition of simulation-1, the impulse response is converged (referring to FIG. 11a), but under the condition of simulation-2, the impulse response is not converged (referring to FIG. 11b). At this point, in simulation-2, a result of the impulse response regardless of the data number N is formed, and an error is enlarged (referring to FIG. 11b).

Therefore, the impulse response is converged to be 0 in short time that is, simulation-1 can execute simulation with shorter measurement data. In addition, the difference of the time constant is larger for the controlled object with smaller friction D, and the difference of the number of the measured data is more obvious.

Embodiment 3

[Simulation-3]

Figure 12A:
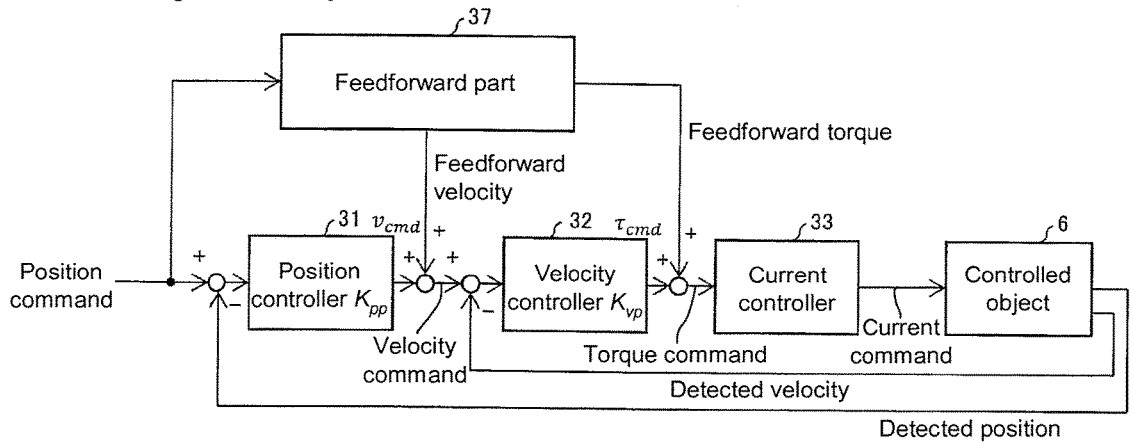
FIGS. 12a to 12c are diagrams illustrating a feedforward part.
Figure 12B:
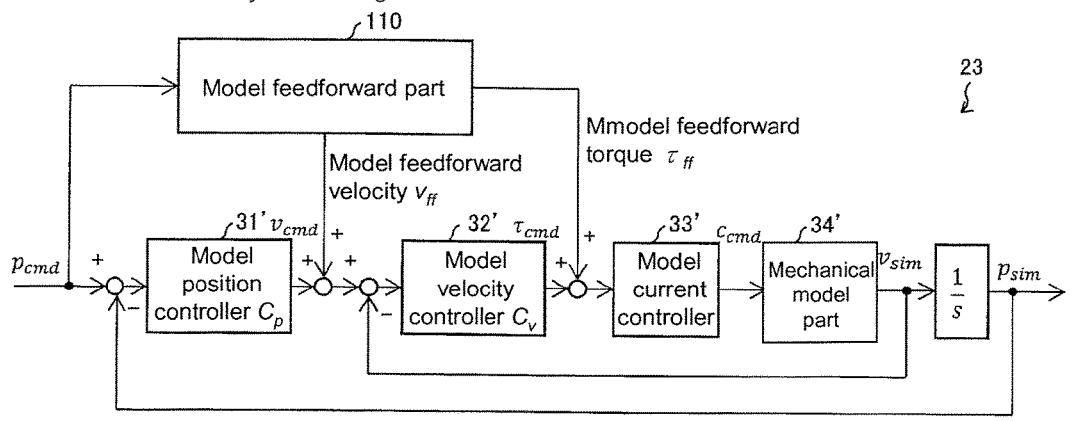
Figure 12C:
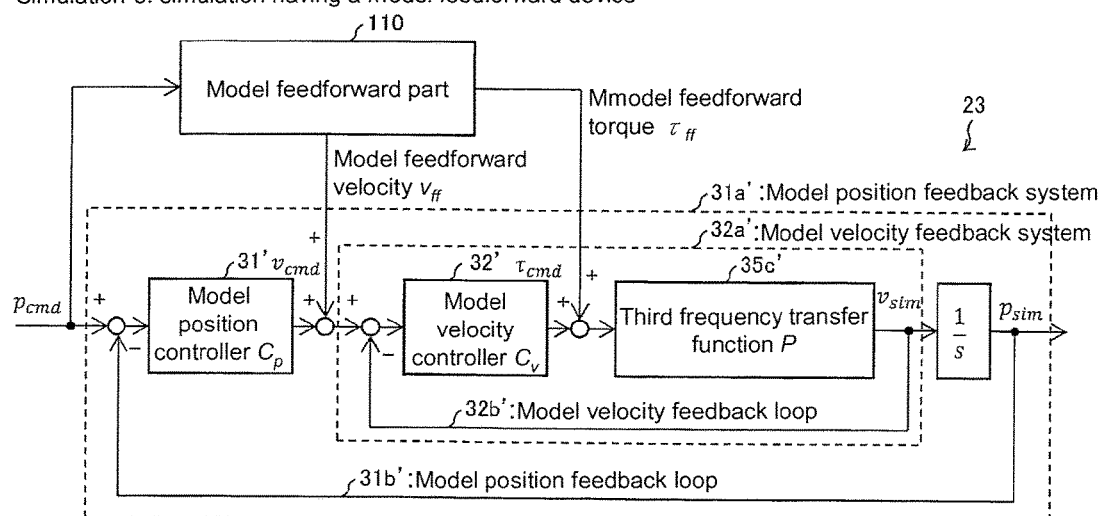

Another embodiment of the present invention is explained based on FIGS. 12a to 12c. In addition, in order to facilitate explanation, the members with the same functions as the members explained in the embodiment are marked with the same signs and the explanation is omitted. FIGS. 12a to 12c are diagrams used for explaining content of simulation-3 in the present embodiment. As shown in FIGS. 12a to 12c, the present embodiment is to add the feedforward to the constitution of simulation-2.

At first, the control structure of the servo driver 2 with a feedforward device is explained by referring to FIG. 12a. As shown in FIG. 12a, under the condition that a feedforward part 37 is disposed in the control structure of the servo driver 2, the feedforward part 37 receives the input of a position command, a feedforward velocity is output in a manner of being added to the velocity command of the position controller 31, and a feedforward torque is output in a manner of being added to the torque command as output of the velocity controller 32.

Therefore, the structure of the simulation system executing the simulation of the servo driver 2 containing the feedforward is as shown in FIG. 12b, a model feedforward part 110 corresponding to the feedforward part 37 is disposed, the model feedforward part 110 receives input of the position command $p_{cmd}$, and outputs a model feedforward velocity $v_{ff}$ and a model feedforward torque $\tau_{ff}$. In addition, the system containing the model feedforward part 110 is called as a feedforawrd system.

The simulation when the model feedforward part 110 is contained is explained by referring to FIG. 12c. In addition, the simulation is same as simulation-1 of embodiment 2 till the impulse response $g_{imp}$ is solved.

After the impulse response $g_{imp}$ is solved, the position response (time sequence arrangement $p_{sim}$) and the velocity response (time sequence arrangement) $v_{sim}$ relative to the position command (time sequence arrangement $p_{cmd}$) are solved by the following computing, which is a convolution performing impulse response $g_{imp}$.

```
FOR repeating m=0 to a length quantity to be simulated DO
    P_err=P_cmd[m]-p_sim[m-1]...the position deviation p_err is calculated.
    v_ff is solved according to p_cmd
    v_cmd=K_pp·p_err+v_ff
    v_err=v_cmd-v_sim[m-1]...the velocity deviation v_err is calculated.
    τ_ff is solved according to p_cmd and v_cmd
    τ_cmd=K_vp·V_err +τ_ff
    FOR only repeating n=0 to a length quantity of g_v_imp DO
        v_sim[m+n]=τ_cmd·g_imp[n]...convolution
    ENDFOR
    p_sim[m]=p_sim[m-1]+v_sim[m]·Δt...the velocity is subjected to integration to solve the position
ENDFOR
```

Therefore, the simulation can be executed by feedforward. Besides, the condition which is called as gain schedule generally and in which the gain (position gain, velocity gain: control parameter) is changed in the motor actuation process is simulated.

In addition, if only the velocity $v_{cmd}$ is added to the constitution of the feedforward, then the constitution of the simulation-1 of the embodiment 1 can be added with the feedforward constitution.

[Variable Examples]

Figure 13:
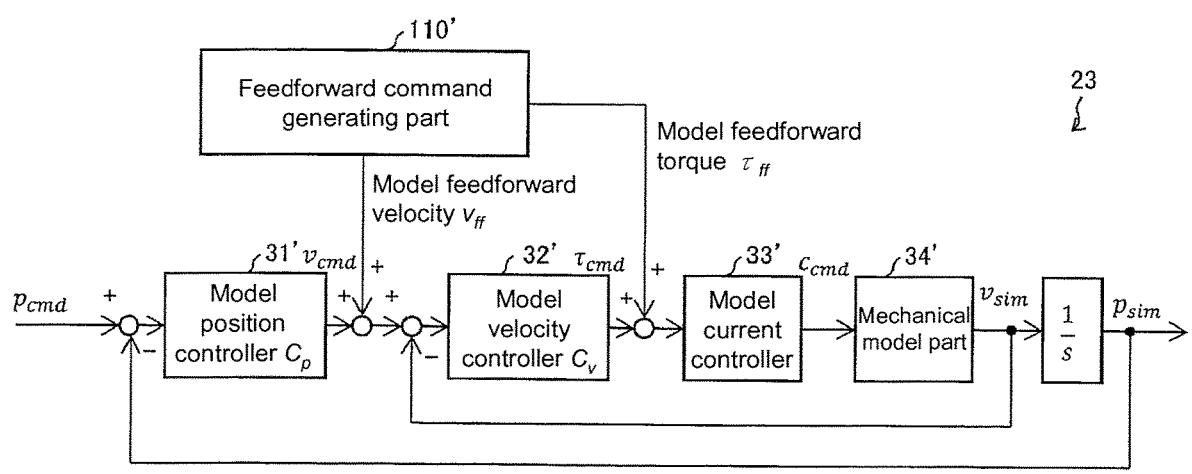
FIG. 13 is a diagram of a variable example of a simulation system having feedforward.

In addition, the aforesaid model feedforward 110 may not be disposed, as shown in FIG. 13, an independent block (feedforward command generating part 110') generates the constitution of a feedforward value. The computing method at this point is as follows.

At first, in the feedforward command generating part 110', the feedforward value is prepared in advance as the time sequence arrangement $v_{ff}[m]$ and $\tau_{ff}[m]$. Besides, the following computing is performed.

```
FOR repeating m=0 to a length quantity to be simulated DO
    p_err=p_cmd[m]-p_sim[m-1]
    v_cmd=K_pp·p_err +v_ff the velocity command v_cmd is added to the feedforward V_ff
    V_err=V_cmd-V_sim[m-1]
    τ_cmd=(K_vp·V_err+τ_ff the torque command τ_cmd is added to feedforward τ_ff
    FOR only repeating n=0 to a length quantity of g_v_imp DO
        v_sim[m+n]= v_sim[m+n]τ_cmd·g_imp[n]
    ENDFOR
    p_sim[m]=p_sim[m-1]+v_sim[m]·Δt
ENDFOR
```

Embodiment 4

Next, the velocity control simulation is explained with reference to FIGS. 14a to 14d, which are diagrams for explaining a simulation content.

FIG. 14a is a control structure illustrating a mechanical system 7 during velocity control. As shown in FIG. 14a, in velocity control, the following structure is formed, that is, containing velocity controller 32 and a current controller 33 in the servo driver 2 and a controlled object 6 of the mechanical system 7, and the velocity deviation between the velocity command and the detected velocity is input to the velocity controller 32.

Next, the structure of the simulation structure during simulation of velocity control is explained with reference to FIG. 14b. As shown in FIG. 14b, in the simulation system, the control structure of the mechanical structure as shown in FIG. 14a becomes the structure containing the model velocity controller 32', the model current controller 33' and the mechanical model part 34'.

[Simulation-4]

Simulation-4 is explained with reference to FIG. 14c. In simulation-4, the model velocity controller 32', the model current controller 33' and the mechanical model part 34' of the simulation system are replaced with a frequency transfer function for simulation (second frequency transfer function $G_{v\_closed}$) for executing simulation.

A specific computing method is as follows.

Similar to the aforesaid simulation-1, the frequency transfer function $G_{v\_closed}$ is subjected to inverse Fourier transform to solve the impulse response $g_{imp}$, which represents a velocity response of the velocity impulse command.

$$g_{imp}[N]=IFFT(G_{v\_closed}[N])$$

Besides, the position response (time sequence arrangement $p_{sim}$) and the velocity response (time sequence arrangement $v_{sim}$) relative to the velocity command (time sequence arrangement $v_{cmd}$) are solved by the following computing.

```
FOR repeating m=0 to a length quantity to be simulated DO
    FOR only repeating n=0 to a length quantity of g_v_imp DO
        v_sim[m+n]= v_sim[m+n]+v_cmd·g_imp[n]...convolution
    ENDFOR
    p_sim[m]=p_sim[m−1]+v_sim[m]·Δt...the velocity is subjected
to integration to solve the position
ENDFOR
```

[Simulation-5]

Next, simulation-5 is explained by referring to FIG. 14d. In simulation-5, the model current controller 33' and mechanical model part 34' of the simulation system are replaced with a frequency transfer function (third frequency transfer function) for executing simulation.

A specific computing method is as follows.

Similar to the aforesaid simulation-2, the frequency transfer function P is subjected to inverse Fourier transform to solve the impulse response $g_{imp}$, which represents a velocity response of the torque impulse command.

$$g_{imp}[N]=IFFT(P[N])$$

Besides, the position response (time sequence arrangement $p_{sim}$) and the velocity response (time sequence arrangement $v_{sim}$) relative to the velocity command (time sequence arrangement $v_{cmd}$) are solved by the following computing.

```
FOR repeating m=0 to a length quantity to be simulated DO
    v_err=v_cmd[m]−v_sim[m−1]...velocity deviation v_err is computed.
    τ_cmd=K_pp·V_err
    FOR only repeating n=0 to a length quantity of g_v_imp DO
        v_sim[m+n]=v_sim[m+n]+v_cmd·g_imp[n]...convolution
    ENDFOR
    p_sim[m]=p_sim[m−1]=v_sim[m]·Δt...the velocity is subjected to
integration to solve the position
ENDFOR
```

Embodiment 5

[Simulation 6]

Figure 15A:
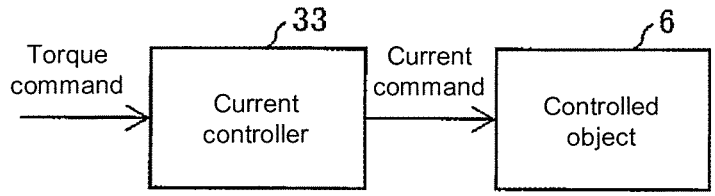
FIGS. 15a to 15c are diagrams for explaining torque control.

Next, the torque control simulation is explained with reference to FIGS. 15a to 15c, which are diagrams for explaining the simulation content of torque control.

The control structure of the mechanical structure 7 when torque control is performed is explained with reference to FIG. 15a. As shown in FIG. 15a, under the condition of performing torque control, the structure containing the current controller 33 and the controlled object 6 is formed, the torque command is input to the current controller 33 and the current command is input to the controlled object 6.

Figure 15B:
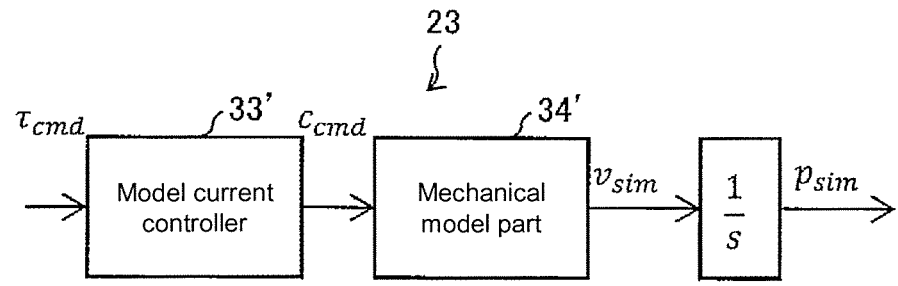

Next, with reference to FIG. 15b, the structure of simulation system during simulation of torque control is explained. As shown in FIG. 15b, in the simulation system, the control structure corresponding to the mechanical structure 7 as shown in FIG. 15a becomes the structure containing the model velocity controller 32', the model current controller 33' and the mechanical model part 34'.

Figure 15C:
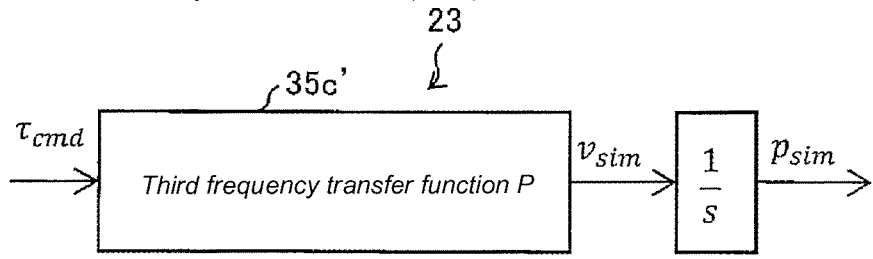

Simulation-6 is explained by referring to FIG. 15c. In simulation-6, the model current controller 33' and the mechanical model part 34' of the simulation system are replaced with a frequency transfer function for simulation (third frequency transfer function P) for executing simulation.

A specific computing method is as follows.

Similar to simulation-2, the frequency transfer function P is subjected to inverse Fourier transform to solve impulse response $g_{imp}$, which represents the velocity response relative to the torque impulse command.

$$g_{imp}[N]=IFFT(P[N])$$

Besides, the position response (time sequence arrangement $p_{sim}$) and the velocity response (time sequence arrangement $v_{sim}$) relative to the velocity command (time sequence arrangement $v_{cmd}$) are solved by the following computing.

```
FOR repeating m=0 to a length quantity to be simulated DO
    FOR only repeating n=0 to a length quantity of g_v_imp DO
        v_sim[m+n]=v_sim[m+n]+v_cmd·g_imp[n]...convolution
    ENDFOR
    p_sim[m]=p_sim[m−1]+v_sim[m−1]·Δt...the velocity is subjected
to integration to solve the position
ENDFOR
```

[Examples Realized by Means of Software]

The control block of the setting device 1 (especially the control part 10 (the parameter setting art 21, the frequency characteristic computing part 22 (the torque command generating part 51 for measurement, the velocity command generating part 52 for measurement, the frequency response function computing part 53 for measurement and the position command generating part 54 for measurement)), the simulation part 23 (the frequency transfer function setting part 40, the impulse response computing part 41, simulation system 42, the second command value generating part 43, the time response outputting part 44 and the frequency response outputting part 45), the actuation indicating part 24 and the acquiring part 25) can be realized by a logic circuit (hardware) formed on an Integrated Circuit (IC chip) and can also be realized by using a Central Processing Unit (CPU) through software.

In the latter condition, the setting device 1 has: a CPU, executing a command of a program of software realizing each function; a Read Only Memory (ROM) or storage device (they are called as "recording medium"), recording the program and various data in a computer (or CPU)-readable manner; and a Random Access Memory (RAM) expanding the program. Besides, the objective of the present invention is finished by reading the program from the recording medium and executing the program through the computer (CPU). As the recording medium, "a non-temporary physical medium", for example, a tape, a disk, a card, a semiconductor memory, a programmable logic circuit, etc., can be used. Besides, the program can be provided to the computer through any transfer medium (communication network or radio waves) capable of transmitting the program. In addition, the present invention can be realized by embodying the program through electronic transfer in a form of a data signal embedded into carriers.

The present invention is not limited to each embodiment, and can be changed in many ways in the scope shown by claims, and the embodiments obtained by properly combining the technical means respectively disclosed in different embodiments also fall within a technical scope of the present invention.

What is claimed is:

1. A simulation device, simulating a mechanical system which has a controlled object containing a motor and a motor control device controlling the motor, comprising:
a frequency response function computing circuit, computing a frequency response function containing characteristics of the controlled object based on a relation between a first command value driving the mechanical system and a measured value of response of the mechanical system driven by the first command value;
a simulation circuit, having a control block structure corresponding to the mechanical system, the control block structure comprises a model velocity controller, a model current controller and a mechanical model circuit;
a parameter setting circuit, setting control parameters changing characteristics of the simulation circuit;
a frequency transfer function setting circuit, setting a velocity closed frequency transfer function computed based on the frequency response function and the control parameters representing characteristics of the model velocity controller into a frequency transfer function for simulation;
an impulse response computing circuit, computing an impulse response by performing inverse Fourier transform on the frequency transfer function for simulation;
a second command value generating circuit, generating a second command value, the second command value being used for simulation by using the impulse response; and
a time response outputting circuit, executing time response simulation of the mechanical system relative to the second command value based on the second command value and the impulse response.

2. The simulation device according to claim 1, wherein
the mechanical system has at least one feedback system as a control block structure,
the simulation circuit has at least one model feedback system corresponding to the feedback system,
the frequency response function computing circuit computes the frequency response function containing the characteristics of the controlled object and not containing the characteristics of the at least one feedback system,
the frequency transfer function setting circuit sets the frequency transfer function for simulation, containing the characteristics of the controlled object and not containing the characteristics of the at least one model feedback system, and
the time response outputting circuit executes the time response simulation of the mechanical system relative to the second command value based on an output value obtained by inputting the second command value into the model feedback system and the impulse response computed by performing inverse Fourier transform on the frequency transfer function for simulation.

3. The simulation device according to claim 2, wherein
the simulation circuit contains a feedforward system, which outputs a feedforward value added to the output value, and
the time response outputting circuit executes the time response simulation of the mechanical system based on an addition value obtained by adding the feedforward value to the output value and the impulse response computed by performing inverse Fourier transform on the frequency transfer function for simulation.

4. The simulation device according to claim 2, wherein
the mechanical system contains a velocity feedback system containing a velocity controller as a control block structure,
the simulation circuit has a model velocity feedback system corresponding to the velocity feedback system,
the frequency response function computing circuit computes the frequency response function containing the characteristics of the controlled object and not containing the characteristics of the velocity feedback system,
the frequency transfer function setting circuit sets the frequency transfer function for simulation, containing the characteristics of the controlled object and not containing the characteristics of the model velocity feedback system, and
the time response outputting circuit executes the time response simulation of the mechanical system based on an output value obtained by inputting the second command value into the model velocity feedback system and the impulse response computed by performing inverse Fourier transform on the frequency transfer function for simulation.

5. The simulation device according to claim 2, wherein
the mechanical system has a position feedback system containing a position controller and a velocity feedback system containing a velocity controller configured on a downstream side of the position controller as a control block structure,
the simulation circuit has a model position feedback system corresponding to the position feedback system and a model velocity feedback system corresponding to the velocity feedback system,
the frequency response function computing circuit computes the frequency response function containing the characteristics of the controlled object and not containing the characteristics of the position feedback system and the velocity feedback system,
the frequency transfer function setting circuit sets the frequency transfer function for simulation, containing the characteristics of the controlled object and the model velocity feedback system and not containing the characteristics of the model position feedback system, and
the time response outputting circuit executes the time response simulation of the mechanical system based on an output value obtained by inputting the second command value into the model position feedback system and the impulse response computed by performing inverse Fourier transform on the frequency transfer function for simulation.

6. The simulation device according to claim 2, wherein
the mechanical system has a position feedback system containing a position controller and a velocity feedback system containing a velocity controller configured on a downstream side of the position controller as a control block structure,
the simulation circuit has a model position feedback system corresponding to the position feedback system and a model velocity feedback system corresponding to the velocity feedback system,
the frequency response function computing circuit computes the frequency response function containing the characteristics of the controlled object and not containing the characteristics of the position feedback system and the velocity feedback system, the frequency transfer function setting circuit sets the frequency transfer function for simulation, containing the characteristics of the controlled object and not containing the characteristics of the model velocity feedback system and the model position feedback system, and the time response outputting circuit executes the time response simulation of the mechanical system based on an output value obtained by inputting the second command value into the model position feedback system, an output value obtained by inputting the second command value into the model velocity feedback system, and the impulse response computed by performing inverse Fourier transform on the frequency transfer function for simulation.

7. The simulation device according to claim 1, wherein the first command value is a torque command value representing a torque, and the frequency response function computing circuit computes the frequency response function based on a relation between the torque command value and a velocity measured value of the response of the mechanical system driven by the torque command value.

8. The simulation device according to claim 1, wherein the first command value is a velocity command value representing a velocity, and the frequency response function computing circuit computes the frequency response function based on a relation between the velocity command value and a velocity measured value of the response of the mechanical system driven by the velocity command value.

9. The simulation device according to claim 1, wherein the first command value is a position command value representing a position, and the frequency response function computing circuit computes the frequency response function based on a relation between the position command value and a position measured value of the response of the mechanical system driven by the position command value.

10. The simulation device according to claim 1, wherein the time response outputting circuit executes the time response simulation of at least any one of position, velocity and torque of the mechanical system relative to the second command value.

11. The simulation device according to claim 1, wherein the parameter setting circuit is structured in a manner of setting parameters of at least one of systems contained in the simulation circuit and corresponding to controllers in the mechanical system respectively.

12. A simulation method, performing simulation of a mechanical system which has a controlled object containing a motor and a motor control device controlling the motor, comprising:

a frequency response function computing step, computing a frequency response function containing characteristics of the controlled object based on a relation between a first command value driving the mechanical system and a measured value of response of the mechanical system driven by the first command value;

a parameter setting step, setting control parameters changing the characteristics of a simulation circuit having a control block structure corresponding to the mechanical system, the control block structure comprises a model velocity controller, a model current controller and a mechanical model circuit;

a frequency transfer function setting step, setting a velocity closed frequency transfer function computed based on the frequency response function and the control parameters representing characteristics of the model velocity controller into a frequency transfer function for simulation;

an impulse response computing step, computing an impulse response by performing inverse Fourier transform on the frequency transfer function for simulation;

a second command value generating step, generating a second command value, the second command value being used for simulation by using the impulse response; and a time response outputting step, executing time response simulation of the mechanical system relative to the second command value based on the second command value and the impulse response.

13. A non-transitory recording medium recording a control program, when the control program is executed, causing a computer having a processor to act as a simulation device to perform operations that simulates a mechanical system which has a controlled object containing a motor and a motor control device controlling the motor, and the operations comprises:

computing a frequency response function containing characteristics of the controlled object based on a relation between a first command value driving the mechanical system and a measured value of response of the mechanical system driven by the first command value;

setting control parameters changing the characteristics of a simulation system having a control block structure corresponding to the mechanical system, the control block structure comprises a model velocity controller, a model current controller and a mechanical model circuit;

setting a velocity closed frequency transfer function computed based on the frequency response function and the control parameters representing characteristics of the model velocity controller into a frequency transfer function for simulation;

computing an impulse response by performing inverse Fourier transform on the frequency transfer function for simulation;

generating a second command value, the second command value being used for simulation by using the impulse response; and executing time response simulation of the mechanical system relative to the second command value based on the second command value and the impulse response.

* * * * *